United States Patent [19]
Takemae et al.

[11] Patent Number: 6,078,514
[45] Date of Patent: Jun. 20, 2000

[54] SEMICONDUCTOR DEVICE AND SEMICONDUCTOR SYSTEM FOR HIGH-SPEED DATA TRANSFER

[75] Inventors: Yoshihiro Takemae; Masao Taguchi; Masao Nakano; Takaaki Suzuki; Hiroyoshi Tomita; Toshiya Uchida; Yasuharu Sato; Atsushi Hatakeyama; Masato Matsumiya; Yasurou Matsuzaki, all of Kawasaki, Japan

[73] Assignee: Fujitsu Limited, Kanagawa, Japan

[21] Appl. No.: 09/061,023

[22] Filed: Apr. 16, 1998

[30] Foreign Application Priority Data

Sep. 9, 1997 [JP] Japan ................................. 9-244285

[51] Int. Cl.⁷ .......................... H01L 25/04; H01L 23/36
[52] U.S. Cl. ........................ 365/63; 365/72; 257/678; 257/690; 257/723; 257/724; 257/779; 257/784
[58] Field of Search .................. 365/63, 72; 257/678, 257/690, 723, 724, 779, 784

[56] References Cited

U.S. PATENT DOCUMENTS

| | | | |
|---|---|---|---|
| 4,858,175 | 8/1989 | Sato | 365/900 |
| 4,996,587 | 2/1991 | Hinrichsmeyer et al. | 357/4 |
| 5,670,824 | 9/1997 | Weinberg | 257/723 |
| 5,723,906 | 3/1998 | Rush | 257/723 |
| 5,789,816 | 8/1998 | Wu | 257/723 |
| 5,801,433 | 9/1998 | Nakao | 257/666 |
| 5,808,877 | 9/1998 | Leong et al. | 365/813 |
| 5,822,255 | 10/1998 | Uchida | |
| 5,844,297 | 12/1998 | Crafts et al. | 257/530 |

FOREIGN PATENT DOCUMENTS

| | | |
|---|---|---|
| 2680278 | 2/1993 | France . |
| 60-220955 | 11/1985 | Japan . |
| 4-24957 | 1/1992 | Japan . |
| 4-309257 | 10/1992 | Japan . |
| 5-114693 | 5/1993 | Japan . |
| 6-169058 | 6/1994 | Japan . |
| 6-177321 | 6/1994 | Japan . |
| 63-281450 | 11/1998 | Japan . |

*Primary Examiner*—Viet Q. Nguyen
*Attorney, Agent, or Firm*—Nikaido Marmelstein Murray & Oram LLP

[57] ABSTRACT

A semiconductor system includes at least one logic chip and at least one memory chip arranged such that one side of the at least one memory chip faces one side of the at least one logic chip. The semiconductor system further includes first input/output nodes, provided for the at least one logic chip, for data transfer with an adjacent memory chip, second input/output nodes, provided for the at least one memory chip, for data transfer with an adjacent logic chip, and a package housing the at least one logic chip and the at least one memory chip, wherein the first input/output nodes are arranged along the one side of the at least one logic chip, and the second input/output nodes are arranged along the one side of the at least one memory chip.

43 Claims, 23 Drawing Sheets

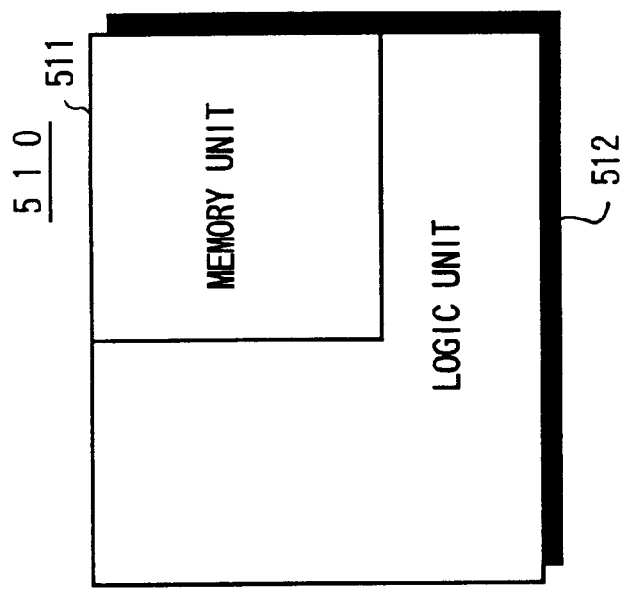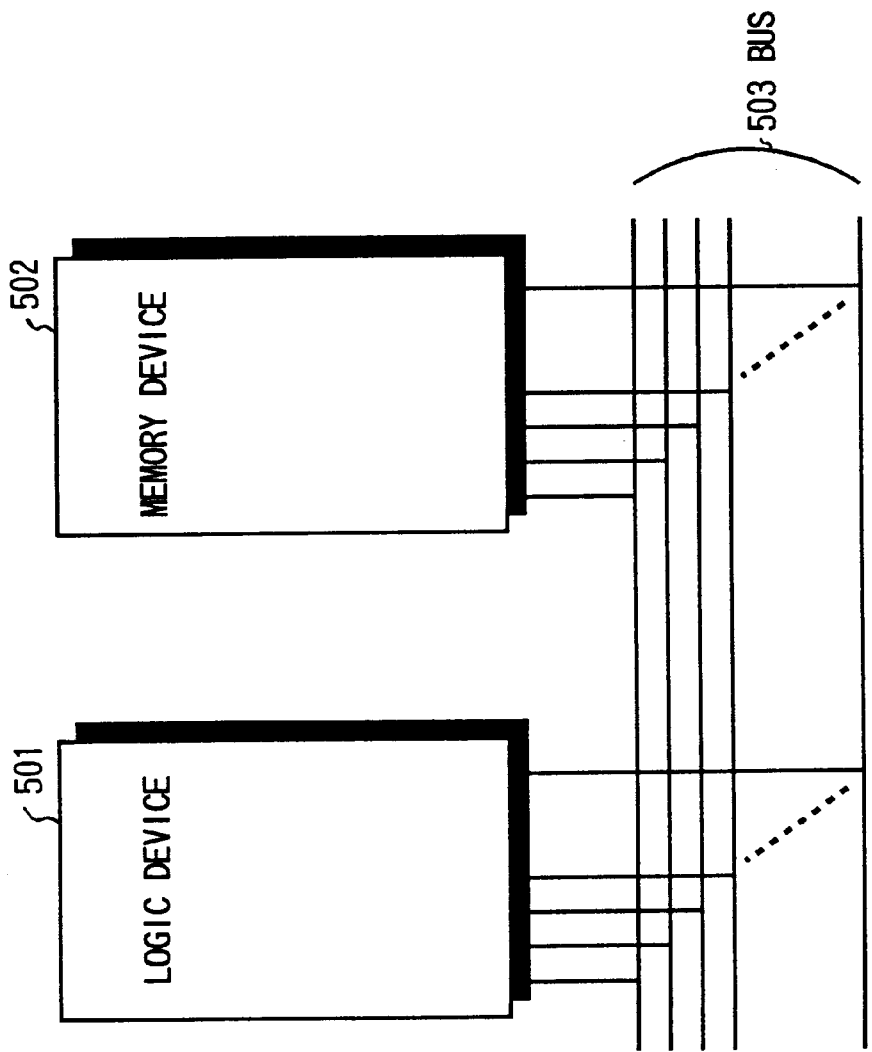

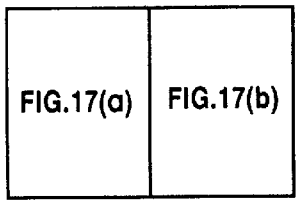
FIG.17
FIG.17(a)
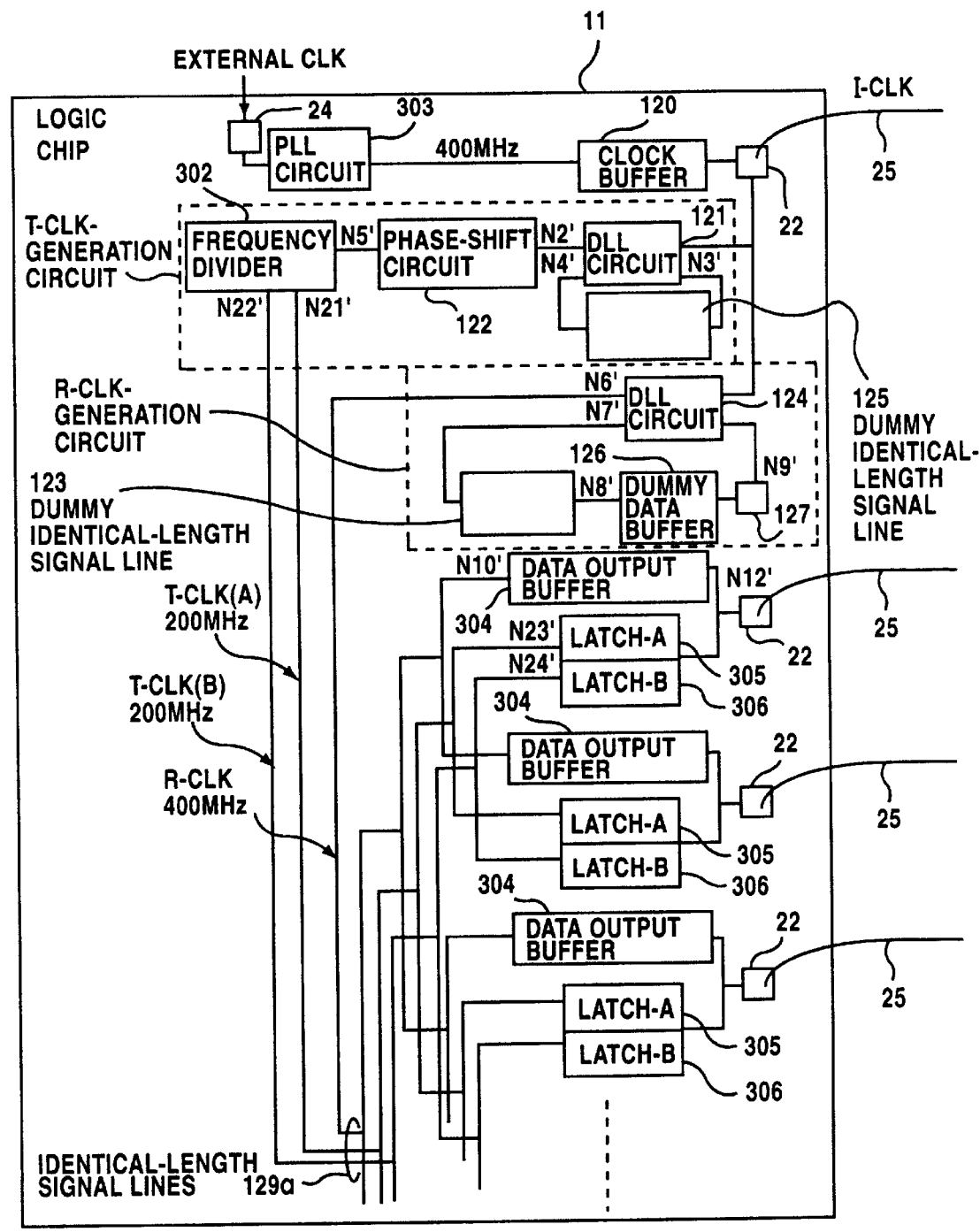
FIG.17(a)

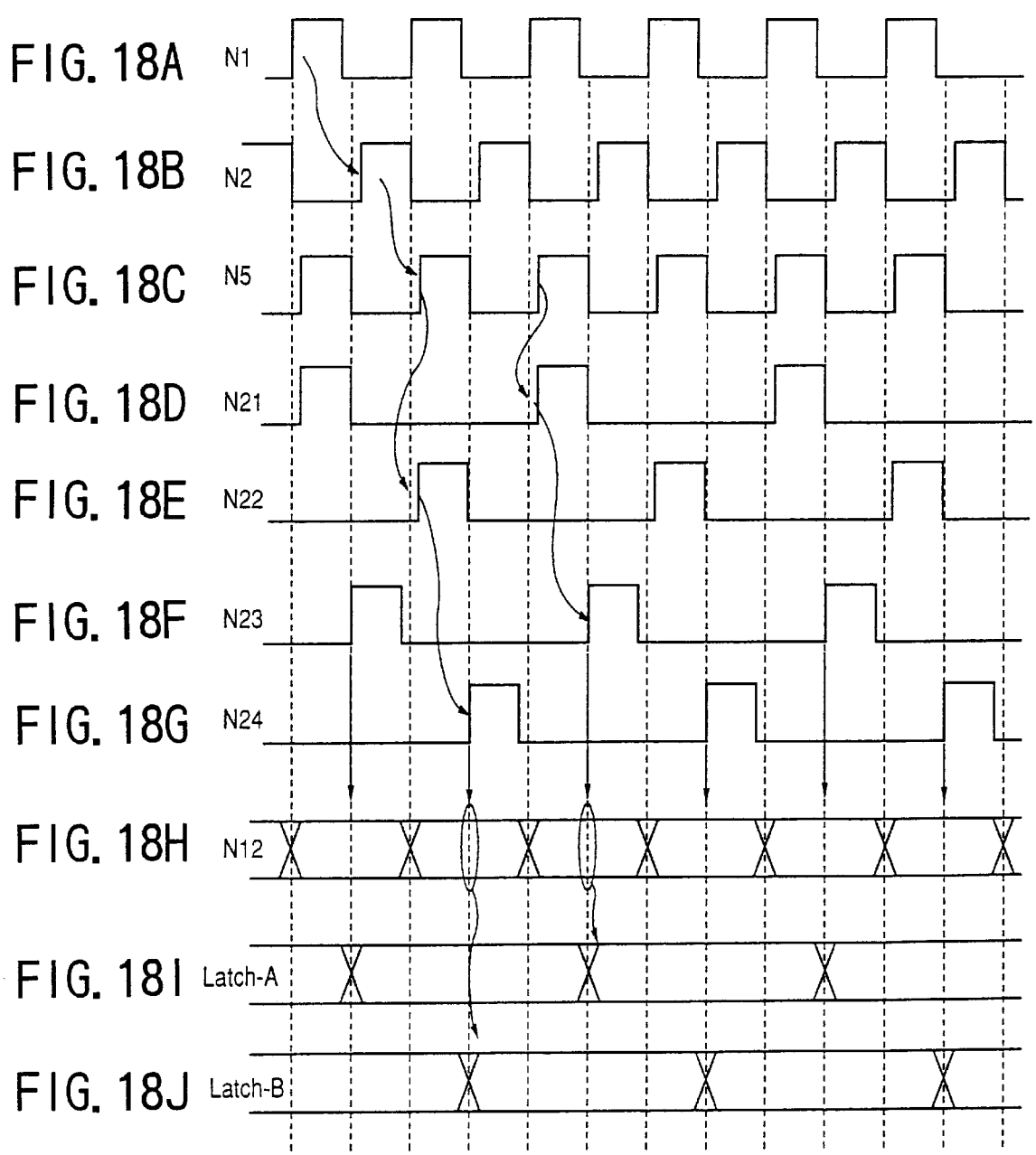

SEMICONDUCTOR DEVICE AND SEMICONDUCTOR SYSTEM FOR HIGH-SPEED DATA TRANSFER

BACKGROUND OF THE INVENTION

1. Field of the Invention

The present invention generally relates to semiconductor devices and semiconductor systems, and particularly relates to a MCP (multi-chip package) device which has one package containing a memory chip and a logic chip.

2. Description of the Related Art

When connecting a logic device with a memory device, generally, a common bus is used for connecting between the devices. FIG. 1A is an illustrative drawing of a related-art configuration in which a logic device is connected to a memory device via a common bus. As shown in FIG. 1A, a common bus 503 connects between a logic device 501 and a memory device 502, and performs data transfer therebetween.

An increase in data-transfer speed between the logic device 501 and the memory device 502 is required for enhancing a data processing performance. In order to achieve this, the number of signal lines of the bus 503 may be incremented in FIG. 1A, and/or a frequency of a clock signal may be increased with regard to data transfer. An increase in the number of bus signal lines is not particularly desirable in that the bus signal lines end up occupying a larger area in a chip, and, also, power consumption will be increased.

An attempt to raise the frequency of a data-transfer clock signal is generally hampered by a limit of signal-transfer capacities of the bus signal lines and/or by a limit of data-input/output speed of each device. Difficulties will be encountered, therefore, when one tries to increase the frequency beyond these limits.

One-chip LSIs in which a logic device and a memory device are implemented on the same chip offers a solution to the above-identified problems. FIG. 1B is an illustrative drawing showing a one-chip LSI which integrates a logic device and a memory device into one chip. As shown in FIG. 1B, a one-chip LSI 510 includes a memory unit 511 and a logic unit 512 implemented thereon. Since the memory unit 511 and the logic unit 512 are connected to each other via internal signal lines inside the chip, a high-speed data transfer can be achieved.

Manufacturing of one-chip LSIs, however, requires efforts to develop a new process technology for creating the memory unit 511 and the logic unit 512 via the same process, thereby incurring an increased cost. Further, when the memory unit 511 and the logic unit 512 are manufactured by a common process, a resulting performance of the chip is likely to be less than those which can be expected when each unit is manufactured by a dedicated separate process.

As described above, when a common bus is used for connecting a logic device and a memory device, difficulties are encountered in boosting data-transfer speed between the two devices. On the other hand, one-chip LSIs in which a logic unit and a memory unit are implemented on the same chip have drawbacks in an increased cost and a reduced performance.

Accordingly, there is a need for a semiconductor system which can achieve a data-transfer speed compatible to that of one-chip LSIs at a low cost.

SUMMARY OF THE INVENTION

Accordingly, it is a general object of the present invention to provide a semiconductor system which can achieve the need described above.

It is another and more specific object of the present invention to provide a semiconductor system which can achieve a data-transfer speed compatible to that of one-chip LSIs at a low cost.

In order to achieve the above objects according to the present invention, a semiconductor system includes at least one logic chip and at least one memory chip arranged such that one side of the at least one memory chip faces one side of the at least one logic chip. The semiconductor system further includes first input/output nodes, provided for the at least one logic chip, for data transfer with an adjacent memory chip, second input/output nodes, provided for the at least one memory chip, for data transfer with an adjacent logic chip, and a package housing the at least one logic chip and the at least one memory chip, wherein the first input/output nodes are arranged along the one side of the at least one logic chip, and the second input/output nodes are arranged along the one side of the at least one memory chip.

In the semiconductor system described above, the logic chip and the memory chip are implemented in the same package, and input/output nodes for inter-chip communication are provided on the opposing sides of the chips, so that connections of the input/output nodes between the chips can be easily made. Further, the input/output nodes may be connected by connection lines having an identical length and taking the shortest path between the chips, so that signal skews can be eliminated. In this case, use of wire bonding can reduce wire capacitance, thereby achieving high-speed data transfer between the chips. Further, common power-voltage may be used for input/output circuits of the adjacent chips, so that signal levels can be made equal between the input side and the output side, achieving high-speed data transfer. If this common power voltage is provided for exclusive use by the input/output circuits, a detrimental effect of fluctuations in power-voltage levels can be avoided when such fluctuations are caused by operations of other circuit elements. Moreover, the memory chip may be provided with a set of nodes for data exchange with the outside of the package. This makes it easier to conduct data exchange with external memory devices.

According to one aspect of the present invention, a semiconductor device includes a clock-input node situated on one side of a chip, a plurality of input/output nodes arranged along the one side, a control-clock generation circuit which generates an input/output-control clock signal based on a received clock signal received by the clock-input node, a plurality of input/output circuits which conduct data output and data input via the input/output nodes in synchronism with the input/output-control clock signal, and a plurality of connection lines having an identical length and connecting between the control-clock generation circuit and the plurality of input/output circuits.

In the semiconductor device described above, the input/output nodes for data transfer and the clock-input node for receiving the clock signal from a counterpart device are provided along one side of the chip. When the semiconductor device is arranged such that this side faces one side of the counterpart-device chip, connection for data transfer can be easily made, and the same clock signal as that of the counterpart device can be used. Further, since the identical-length connection lines are used for connecting the control-clock generation circuit with the input/output circuits, reliable synchronization for data input/output can be established by the input/output circuits. The control-clock generation circuit may perform phase control based on a feedback loop which takes into account signal delays of the identical-length connection lines and the like, so that an input-clock signal having an appropriate phase can be obtained for the purpose of data input, and an output-clock signal having an appropriate phase can be obtained for the purpose of data output. Moreover, a frequency of the input-clock signal may be subjected to 1/N-frequency division to conduct N staggered data-input operations. This achieves a data-transfer frequency N times as high as that of an internal-circuit operation frequency. Further, the clock signal supplied from the counterpart device may be returned to the counterpart device without any change, so that the counterpart device can attend to a synchronization control taking into account inter-chip signal delays.

According to another aspect of the present invention, a semiconductor device includes an internal-clock generation circuit which receives an external clock signal provided from an external source and generates an internal-clock signal, a clock-output node situated on one side of a chip and outputting the internal-clock signal, a plurality of input/output nodes arranged along the one side, a control-clock generation circuit which generates an input/output-control clock signal based on the internal-clock signal, a plurality of input/output circuits which conduct data output and data input via the input/output nodes in synchronism with the input/output-control clock signal, and a plurality of connection lines having an identical length and connecting between the control-clock generation circuit and the plurality of input/output circuits.

In the semiconductor device described above, the input/output nodes for data transfer and the clock-output node for transmitting the clock signal to a counterpart device are provided along one side of the chip. When the semiconductor device is arranged such that this side faces one side of the counterpart-device chip, connection for data transfer can be easily made, and it is possible to let the counterpart device use the same clock signal. Further, since the identical-length connection lines are used for connecting the control-clock generation circuit with the input/output circuits, reliable synchronization for data input/output can be established by the input/output circuits. The control-clock generation circuit may perform phase control based on a feedback loop which takes into account signal delays of the identical-length connection lines and the like, so that an input-clock signal having an appropriate phase can be obtained for the purpose of data input, and an output-clock signal having an appropriate phase can be obtained for the purpose of data output. Moreover, a frequency of the input-clock signal may be subjected to 1/N-frequency division to conduct N staggered data-input operations. This achieves a data-transfer frequency N times as high as that of an internal-circuit operation frequency. Further, the clock signal transmitted to the counterpart device may be returned and received without any change except for some delay, and this received clock signal may be used for establishing synchronization with regard to the data-input operations. This achieves a synchronization control taking into account inter-chip signal delays.

According to another aspect of the present invention, a semiconductor system includes at least one first semiconductor chip, at least one second semiconductor chip arranged such that one side of the at least one second semiconductor chip faces one side of the at least one first semiconductor chip, and a package housing the at least one first semiconductor chip and the at least one second semiconductor chip, wherein the at least one first semiconductor chip and the at least one second semiconductor chip include at least one logic chip and at least one memory chip. The at least one first semiconductor chip includes an internal-clock generation circuit which receives an external clock signal provided from an external source and generates an internal-clock signal, a clock-output node situated on the one side of the at least one first semiconductor chip and outputting the internal-clock signal, a plurality of first input/output nodes arranged along the one side of the at least one first semiconductor chip, a first control-clock generation circuit which generates a first input/output-control clock signal based on the internal-clock signal, a plurality of first input/output circuits which conduct data output and data input via the first input/output nodes in synchronism with the first input/output-control clock signal, and a plurality of connection lines having an identical length and connecting between the first control-clock generation circuit and the plurality of first input/output circuits. The at least one second semiconductor chip includes a clock-input node situated on the one side of the at least one second semiconductor chip and receiving the internal-clock signal from the at least one first semiconductor chip, a plurality of second input/output nodes arranged along the one side of the at least one second semiconductor chip and connected to the plurality of first input/output nodes, a second control-clock generation circuit which generates a second input/output-control clock signal based on the internal-clock signal received at the clock-input node, a plurality of second input/output circuits which conduct data output and data input via the second input/output nodes in synchronism with the second input/output-control clock signal, and a plurality of connection lines having an identical length and connecting between the second control-clock generation circuit and the plurality of second input/output circuits.

In the semiconductor system described above, the logic chip and the memory chip are implemented in the same package, and input/output nodes for inter-chip communication are provided on the opposing sides of the chips, so that connections of the input/output nodes between the chips can be easily made. Further, the connection lines having an identical length are used for connecting the control-clock generation circuit with the input/output circuits, thereby helping to establish a reliable synchronization with regard to data input/output operations. Moreover, one of the chips may receive a clock signal returned from the other chip after transmitting said clock signal to the other chip, and establishes a data-input synchronization based on this returned clock signal. This achieves a synchronization control taking into account inter-chip signal delays.

According to another aspect of the present invention, a semiconductor memory chip of $2^M$ bits×N words×$2^L$ banks (M, N, T: integers) includes a clock-input node, M address-signal nodes, N data-input/output nodes, L bank-selection-signal nodes, 3 command-selection nodes, a power-down-signal node, DM-signal nodes provided for a unit of a byte, and a plurality of power-voltage nodes, wherein the clock-input node, the M address-signal nodes, the N data-input/output nodes, the L bank-selection-signal nodes, the 3 command-selection nodes, the power-down-signal node, the DM-signal nodes, and the plurality of power-voltage nodes are provided on one side of the semiconductor memory chip.

In the semiconductor memory chip described above, the nodes for data transfer and the power-voltage nodes are provided on one side of the chip, so that connection for data transfer can be easily made when a logic chip or the like is arranged alongside to face this side of the memory chip. Further, the semiconductor memory chip may be provided with a clock-return node for transmitting a received clock signal without any change, so that the logic chip can use this clock signal returned via the clock-return node to achieve synchronization control taking into account inter-chip signal delays. Moreover, the memory chip may be provided with dedicated power-voltage nodes which supply dedicated power voltages to a PLL/DLL circuit, thereby insuring stable operations of the PLL/DLL circuit.

According to another aspect of the present invention, a semiconductor system includes a package and a plurality of semiconductor chips contained in the package, wherein the plurality of semiconductor chips includes external-connection pads connected with an outside of the package, inter-chip-connection pads connected between the plurality of semiconductor chips, a first ESD-protection circuit provided for each of the external-connection pads in order to prevent device destruction caused by electrical-static discharge, the first ESD-protection circuit having a first capacity to drive an electric current, and a second ESD-protection circuit provided for each of the inter-chip-connection pads in order to prevent device destruction caused by electrical-static discharge, the second ESD-protection circuit having a second capacity to drive an electric current, wherein the second capacity is smaller than the first capacity.

In the semiconductor system described above, the plurality of semiconductor chips are implemented inside the same package, and pads for connecting between the semiconductor chips are covered by the package, so that these pads do not come in contact with a charged human body in any event. Because of this, ESD-protection circuits provided for these pads can be relatively smaller than ESD-protection circuits provided for external pins in terms of a capacity to conduct an electric current. The smaller the ESD-protection circuits, the smaller the chip size can be, which serves as a merit. Further, a size reduction in the ESD-protection circuits results in a decrease in parasitic capacitance, thereby stepping up a speed of changes in signal levels. This achieves high-speed data transfer.

Other objects and further features of the present invention will be apparent from the following detailed description when read in conjunction with the accompanying drawings.

BRIEF DESCRIPTION OF THE DRAWINGS

FIG. 1A is an illustrative drawing of a related-art configuration in which a logic device is connected to a memory device via a common bus;

FIG. 1B is an illustrative drawing showing a one-chip LSI which integrates a logic device and a memory device into one chip

FIG. 18A through 18J are timing charts for explaining operations of the memory chip;

DESCRIPTION OF THE PREFERRED EMBODIMENTS

In the following, embodiments of the present invention will be described with reference to the accompanying drawings.

Figure 2:
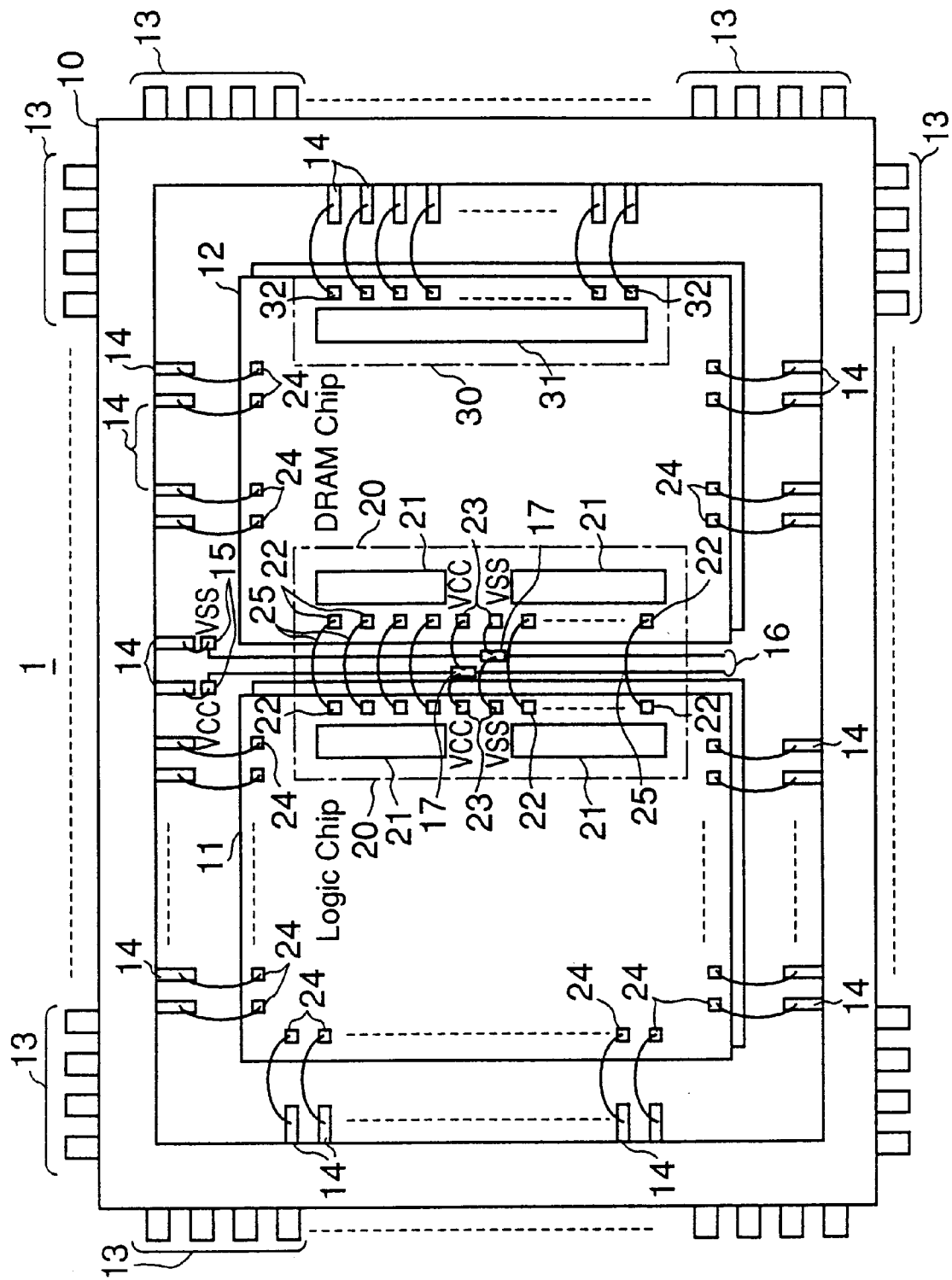
FIG. 2 is an illustrative drawing of an embodiment of a semiconductor system having a logic chip and a memory chip contained in a single package according to the present invention.

FIG. 2 is an illustrative drawing of an embodiment of a semiconductor system having a logic chip and a memory chip contained in a single package according to the present invention.

A semiconductor system 1 of FIG. 2 includes a logic chip 11 and a memory chip 12 contained in a package 10. The logic chip 11 and the memory chip 12 are arranged alongside such that one side of one chip faces one side of the other chip. The package 10 includes external pins 13 for signal input/output with regard to an outside of the device, and connection pins 14 connected to the logic chip 11 or the memory chip 12. The external pins 13 are electrically connected to the connection pins 14 (electrical connections are not shown).

The package 10 further includes I/O-circuit-power-supply pads 15, which receive the power voltage VCC and the ground voltage VSS from an external power source via the connection pins 14. For the purpose of conveying the power voltage VCC and the ground voltage VSS, I/O-circuit-power-supply lines 16 extend from the I/O-circuit-power-supply pads 15, and are connected to the logic chip 11 and the memory chip 12. Nodes 17 are provided for the I/O-circuit-power-supply lines 16.

The connection pins 14 are electrically connected to connection pads 24 of the logic chip 11 or the memory chip 12, or connected to external-memory-device pads 32 of the memory chip 12. The electrical connections are provided by means of wire bonding.

Each of the logic chip 11 and the memory chip 12 includes a memory-logic-I/O unit 20. The memory-logic-I/O unit 20 includes high-speed-I/O circuits 21, I/O pads 22, and I/O-power-supply pads 23. The I/O pads 22 and the I/O-power-supply pads 23 are arranged along the two sides facing each other between the logic chip 11 and the memory chip 12. The I/O pads 22 of the logic chip 11 are electrically connected via wire bonding 25 to the I/O pads 22 of the memory chip 12 such that corresponding I/O pads 22 facing each other across a gap between the chips are connected with each other. The I/O-power-supply pads 23 are connected via wire bonding or the like to the nodes 17 provided on the I/O-circuit-power-supply lines 16.

Electrical connections of the I/O pads 22 between the logic chip 11 and the memory chip 12 have equal wire length with each other, so that there is no timing difference between data bits. Since the corresponding pads facing each other across the gap are connected with each other as described above, connections between the I/O pads 22 have a minimum wire length.

The high-speed-I/O circuit 21 is comprised of a CMOS-type circuit, as will be described later, and achieves a high-speed data transfer between the logic chip 11 and the memory chip 12. The high-speed-I/O circuit 21 is driven by the power voltage VCC and the ground voltage VSS supplied to the I/O-power-supply pads 23. In the logic chip 11 and the memory chip 12, circuits other than the high-speed-I/O circuits 21 are provided with a power voltage and a ground voltage via the connection pins 14 and the connection pads 24, and these power-supply paths are separate from those of the I/O-power-supply pads 23.

Since the same power voltages are used between the logic chip 11 and the memory chip 12, the same signal amplitude can be used between the logic chip 11 and the memory chip 12, thereby achieving reliable signal transfer. Further, the power voltages for I/O signals are provided via separate power-supply lines from those of the other circuits, so as to tolerate a voltage difference between the power voltages of the high-speed-I/O circuit 21 and the power voltages of the other circuits. This achieves a stable voltage supply to the high-speed-I/O circuit 21.

The I/O pads 22 are connected with each other via the wire bonding 25 rather than via a bus such as the bus 503 shown in FIG. 1A. Because of this, wiring capacitance is relatively small between the logic chip 11 and the memory chip 12, thereby achieving a high-speed data transfer. Another advantage is that it is sufficient for the high-speed-I/O circuits 21 to have a relatively low driving power, so that an area size of the high-speed-I/O circuit 21 can be relatively small. As a result, a larger number of the I/O pads 22 can be arranged along the chip side.

Figure 3:
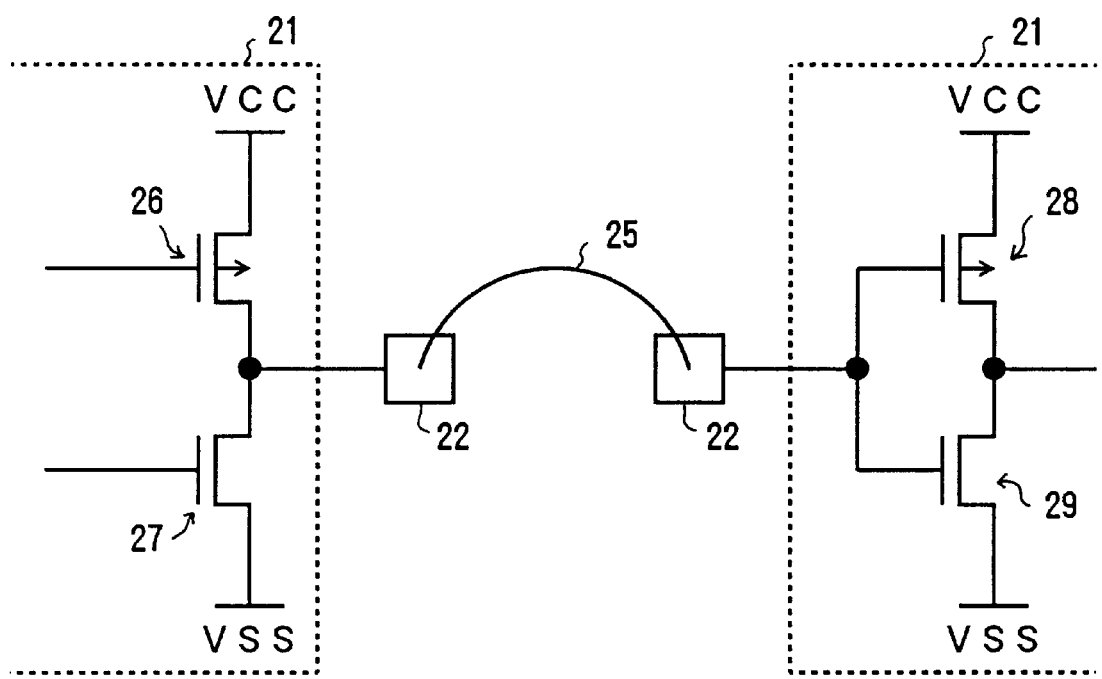
FIG. 3 is a circuit diagram of an output circuit and an input circuit of a high-speed-I/O circuit.

FIG. 3 is a circuit diagram of an output circuit and an input circuit of the high-speed-I/O circuit 21.

As shown in FIG. 3, the output circuit of the high-speed-I/O circuit 21 includes a PMOS transistor 26 and an NMOS transistor 27. The input circuit includes a PMOS transistor 28 and an NMOS transistor 29. The reason why a CMOS-type circuit is used for the input circuit and the output circuit is as follows. In a related-art configuration as shown in FIG. 1A, an increase in a clock frequency of data transfer is accompanied by an increasing effect of signal reflection along the bus 503. In order to reduce the effect of signal reflection, signal amplitudes should be reduced, and bus-termination resistances should be put in place. This makes it difficult to use a CMOS-type circuit for signal input/output. In the configuration of the present invention shown in FIG. 2 and FIG. 3, however, the wire bonding 25 connects between the output circuit and the input circuit, so that there is no need to take into consideration the effect of signal reflection. A large signal amplitude thus can be employed, thereby allowing use of a CMOS-type circuit. Further, since capacitance of the wire bonding 25 is relatively small, a high-speed data transfer is achievable without overly stepping up a current driving power of the output circuit. In the output circuit, therefore, the PMOS transistor 26 and the NMOS transistor 27 can be designed to have a relatively narrow gate width, which makes it possible to reduce the size of the high-speed-I/O circuit 21, thereby allowing a larger number of the I/O pads 22 to be arranged along the side of the chip. Further, since power consumption per circuit is relatively small, the number of the I/O pads 22 can be increased to connect between the logic chip 11 and the memory chip 12 via a larger number of signal lines without requiring large power consumption. Thus a high-speed data transfer can be achieved through expansion of a bus width.

With reference to FIG. 2 again, the memory chip 12 may further include an external-memory-device-I/O unit 30 for data input/output with another memory device provided outside the package 10. The external-memory-device-I/O unit 30 includes an external-memory-device-I/O circuit 31 and the external-memory-device pads 32. The external-memory-device pads 32 are electrically connected to the external pins 13 of the package 10 via the connection pins 14. The external-memory-device pads 32 are provided along one side of the memory chip 12 which is different from the side accommodating the I/O pads 22. The external-memory-device-I/O circuit 31 may be a normal I/O circuit having compatibility with a bus to which the semiconductor system 1 is connected. The external-memory-device-I/O circuit 31 does not have to be capable of a high-speed data transfer as fast as that of the high-speed-I/O circuit 21.

Figure 4:
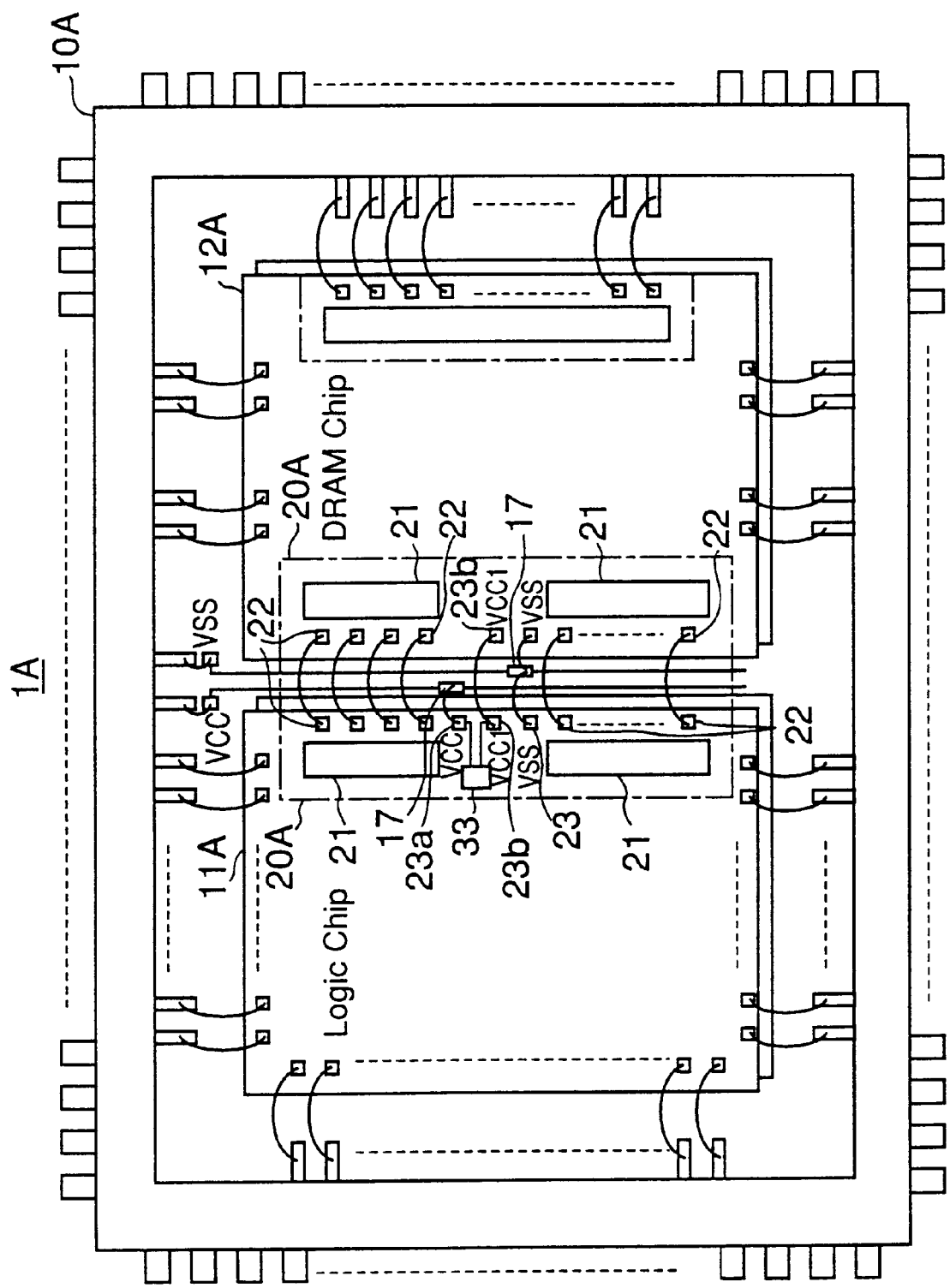
FIG. 4 is an illustrative drawing showing another embodiment in which a logic chip and a memory chip are contained in the same package according to the present invention.

FIG. 4 is an illustrative drawing showing another embodiment in which a logic chip and a memory chip are contained in the same package according to the present invention. In FIG. 4, the same elements as those of FIG. 2 are referred to by the same numerals.

A semiconductor system 1A of FIG. 4 includes a package 10A, a logic chip 11A, and a memory chip 12A. The embodiment of FIG. 4 differs from that of FIG. 2 in a configuration for supplying I/O power to the logic chip 11A and the memory chip 12A.

The logic chip 11A of FIG. 4 includes a voltage-reduction circuit 33 which receives a power voltage, and reduce the voltage level of the power voltage to generate a reduced voltage. The voltage-reduction circuit 33 receives the power voltage VCC from one of the nodes 17 via an I/O-power-supply pad 23a, and supplies the reduced voltage VCC1 to an I/O-power-supply pad 23b. The I/O-power-supply pad 23b of the logic chip 11A is electrically connected to the I/O-power-supply pad 23b of the memory chip 12A via wire bonding or the like. As for the ground voltage VSS, the situation is the same as the embodiment of FIG. 2. That is, the ground voltage VSS is directly supplied to each of the logic chip 11A and the memory chip 12A from one of the nodes 17 via the I/O-power-supply pads 23.

The configuration described above ensures that an identical voltage level is used as the reduced voltage VCC1 in the logic chip 11A and the memory chip 12A when the reduced voltage VCC1 obtained by reducing the power voltage VCC is employed for driving the high-speed-I/O circuit 21. This achieves use of the same signal amplitude between the logic chip 11A and the memory chip 12A, thereby achieving reliable signal transfer.

In FIG. 4, the voltage-reduction circuit 33 is provided in the logic chip 11A. It should be noted, however, that the voltage-reduction circuit 33 may be alternately provided in the memory chip 12A. A configuration of the voltage-reduction circuit 33 is the same as that of a normal voltage-reduction circuit conventionally used in a related-art semiconductor system, and a description thereof will be omitted.

Figure 5:
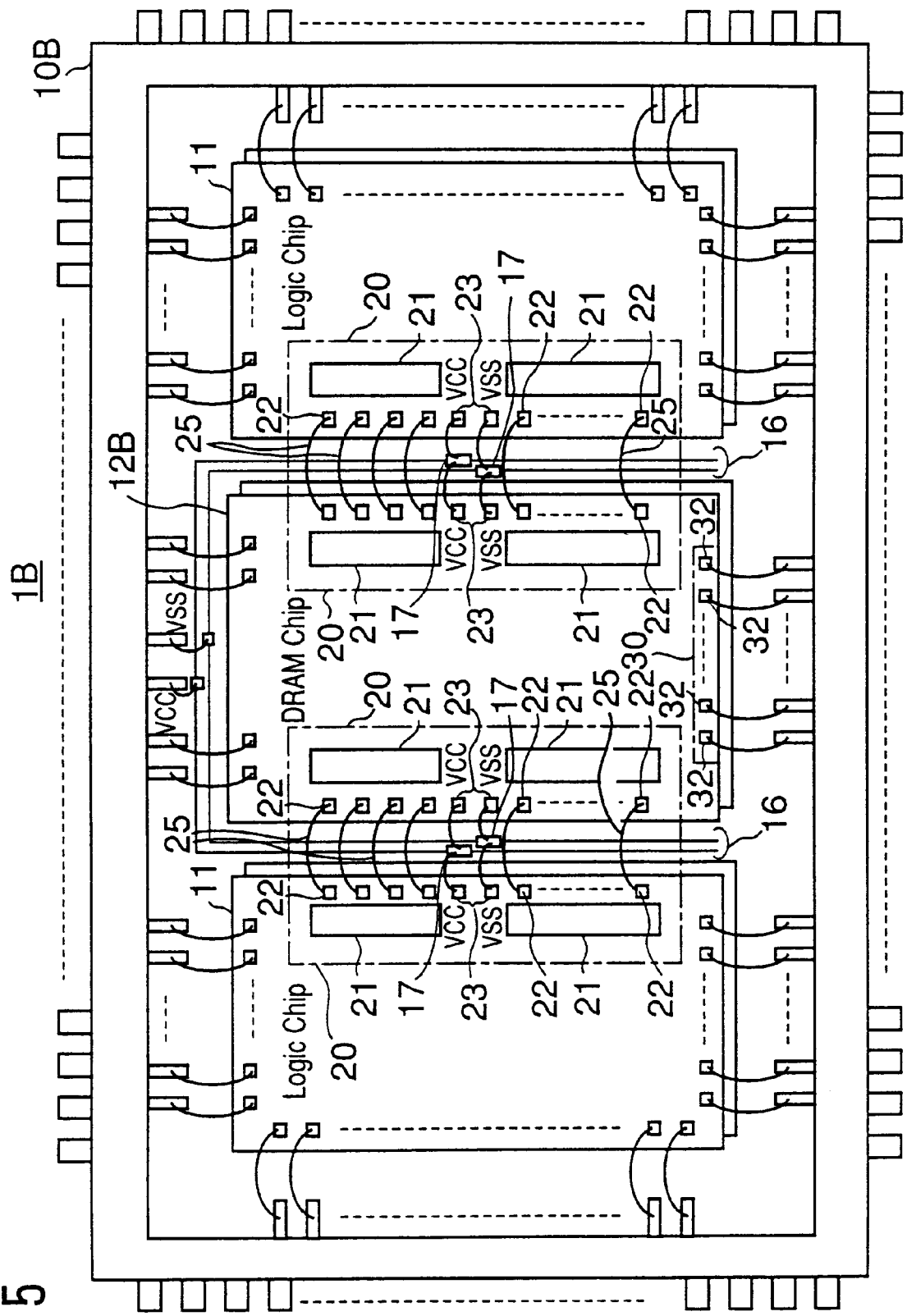
FIG. 5 is an illustrative drawing showing yet another embodiment in which a logic chip and a memory chip are contained in the same package according to the present invention.

FIG. 5 is an illustrative drawing showing yet another embodiment in which a logic chip and a memory chip are contained in the same package according to the present invention. In FIG. 5, the same elements as those of FIG. 2 are referred to by the same numerals.

A semiconductor system 1B of FIG. 5 includes a package 10B, two logic chips 11, and a memory chip 12B. The two logic chips 11 are situated on either side of the memory chip 12B, and the I/O-circuit-power-supply lines 16 are arranged along a gap between either one of the logic chips 11 and the memory chip 12B. The embodiment of FIG. 5 differs from the embodiment of FIG. 2 in that the two logic chips 11, instead of one logic chip 11, are implemented inside the package 10B.

As can be understood from FIG. 5, the I/O pads 22 are arranged along both the right-hand side and the left-hand side of the memory chip 12B. The external-memory-device-I/O unit 30, which performs data input/output with another memory device provided outside the package 10B, is situated on one side, facing the bottom of the figure, of the memory chip 12B.

Figure 6:
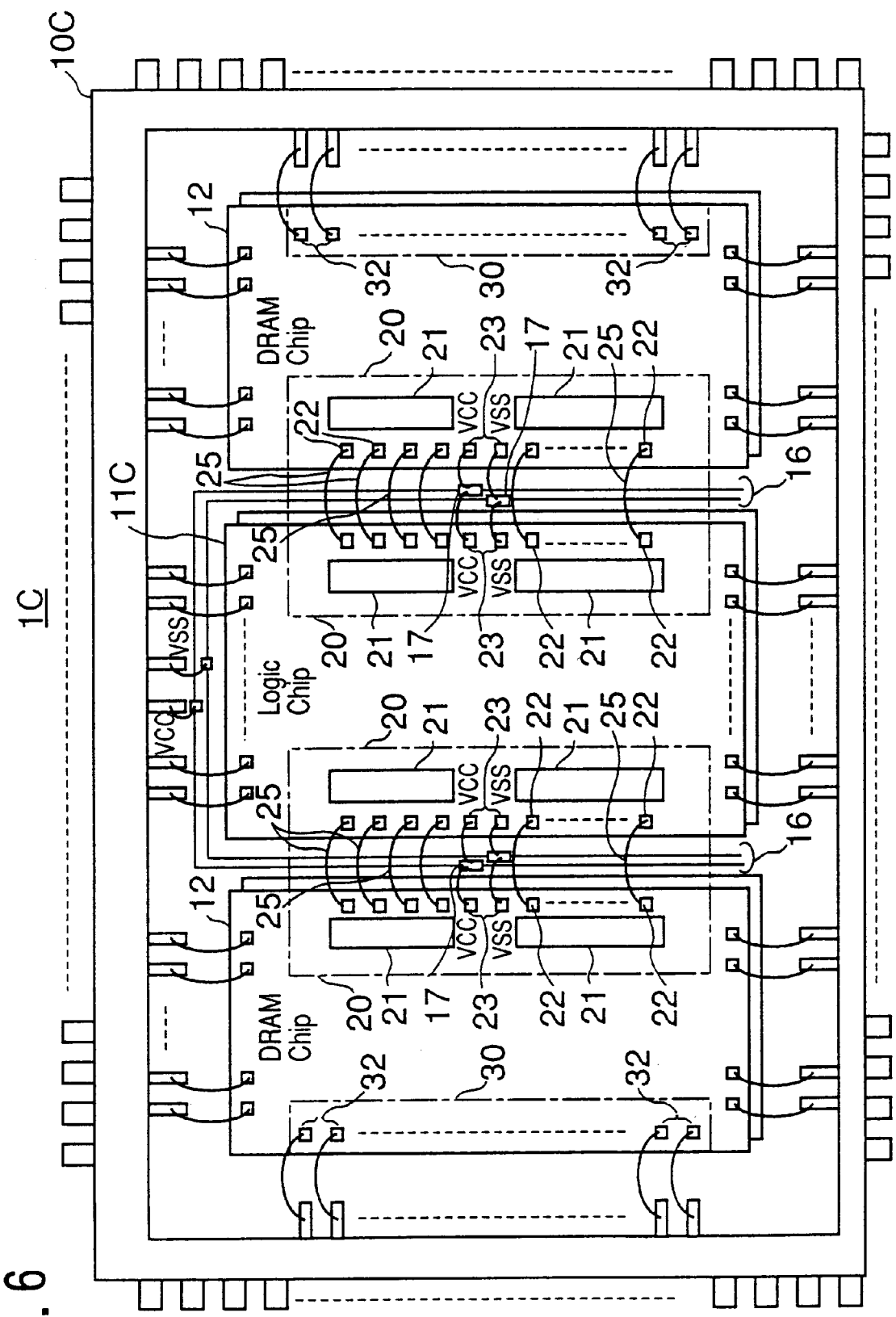
FIG. 6 is an illustrative drawing showing yet another embodiment in which a logic chip and a memory chip are contained in the same package according to the present invention.

FIG. 6 is an illustrative drawing showing yet another embodiment in which a logic chip and a memory chip are contained in the same package according to the present invention. In FIG. 6, the same elements as those of FIG. 2 are referred to by the same numerals.

A semiconductor system 1C of FIG. 6 includes a package 10C, a logic chip 11C, and two memory chips 12. The two memory chips 12 are situated on either side of the logic chip 11C, and the I/O-circuit-power-supply lines 16 are arranged along a gap between either one of the memory chips 12 and the logic chip 11C. The embodiment of FIG. 6 differs from the embodiment of FIG. 2 in that the two memory chips 12, instead of one memory chip 12, are implemented inside the package 10C.

Figure 7:
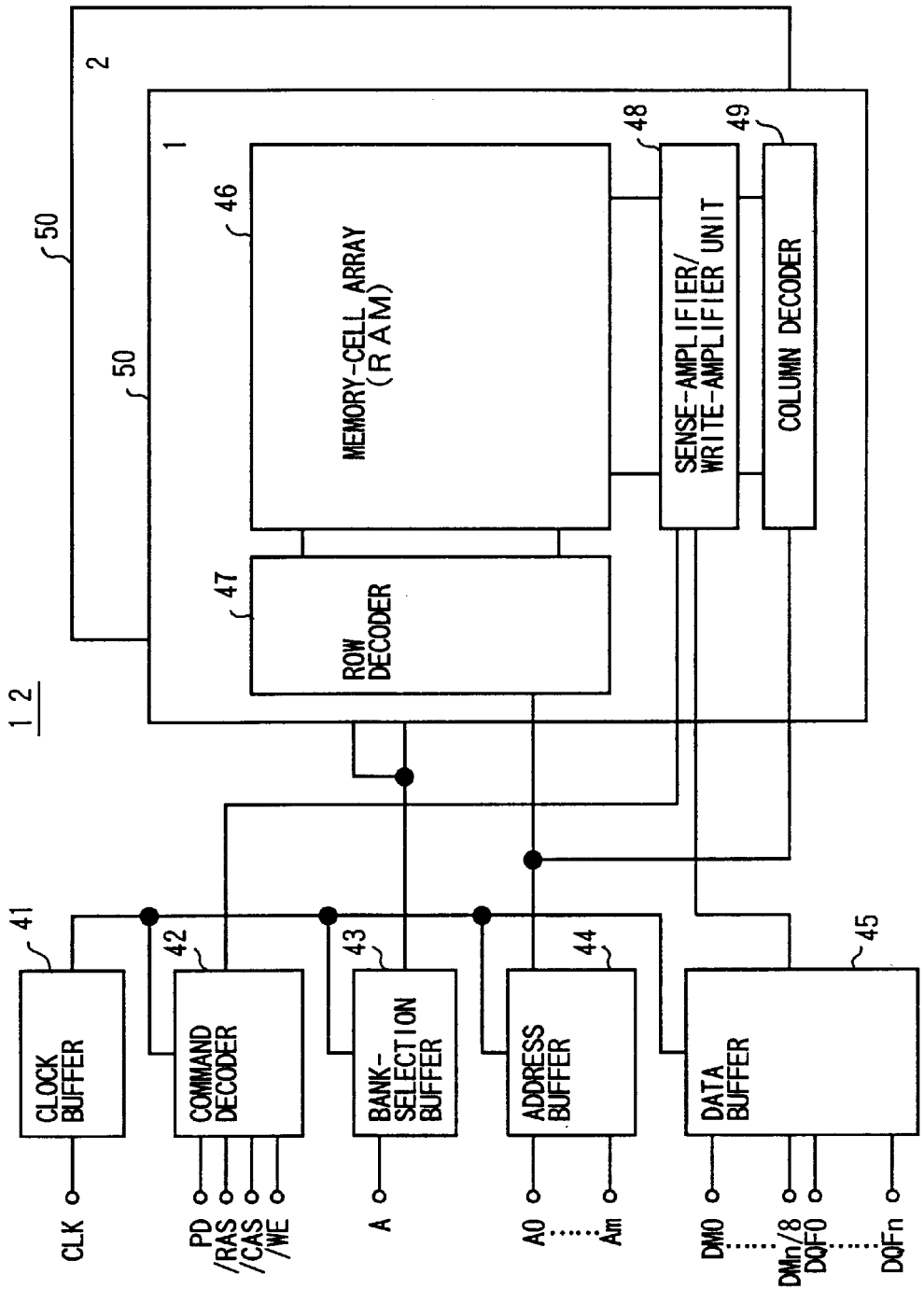
FIG. 7 is a block diagram showing an exemplary configuration of a memory chip shown in FIG. 1.

FIG. 7 is a block diagram showing an exemplary configuration of the memory chip 12 shown in FIG. 1.

The memory chip (DRAM) 12 includes a clock buffer 41, a command decoder 42, a bank-selection buffer 43, an address buffer 44, a data buffer 45, and a plurality (two in the figure) of banks 50. Each bank 50 includes a memory-cell array 46, a row decoder 47, a sense-amplifier/write-amplifier unit 48, and a column decoder 49. The configuration of the DRAM of FIG. 7 is the same as that of a conventional DRAM, except that buffers such as the data buffer 45 for signal transfer with the logic chip 11 are comprised of the high-speed-I/O circuit 21 having the input/output circuit shown in FIG. 3. In the following, therefore, only a minimum description will be provided with regard to operations of the memory chip 12.

The clock buffer 41 receives a clock signal CLK, and supplies it to the command decoder 42, the bank-selection buffer 43, the address buffer 44, and the data buffer 45. The command decoder 42 reads command signals PD, /RAS, /CAS, and /WE in synchronism with the clock signal CLK, and decodes these signals. According to decoding results, operations of the memory chip 12 are controlled. The bank-selection buffer 43 takes in an address signal A in synchronism with the clock signal CLK. Based on the address signal A, one of the two banks 50 is selected. The address buffer 44 reads address signals A0 through Am in synchronism with the clock signal CLK, and supplies a row address and a column address to the row decoder 47 and the column decoder 49, respectively.

The row decoder 47 of the selected bank 50 accesses the indicated row address of the memory-cell array 46. In the case of data-read operations, data of the row address is stored in the sense-amplifier/write-amplifier unit 48. The column decoder 49 selects the data of the indicated column address to be transferred from the sense-amplifier/write-amplifier unit 48. The data is supplied to the logic chip 11 via the data buffer 45. In the case of data-write operations, data supplied from the logic chip 11 to the data buffer 45 is stored in the memory-cell array 46 via the sense-amplifier/write-amplifier unit 48.

Figure 8:
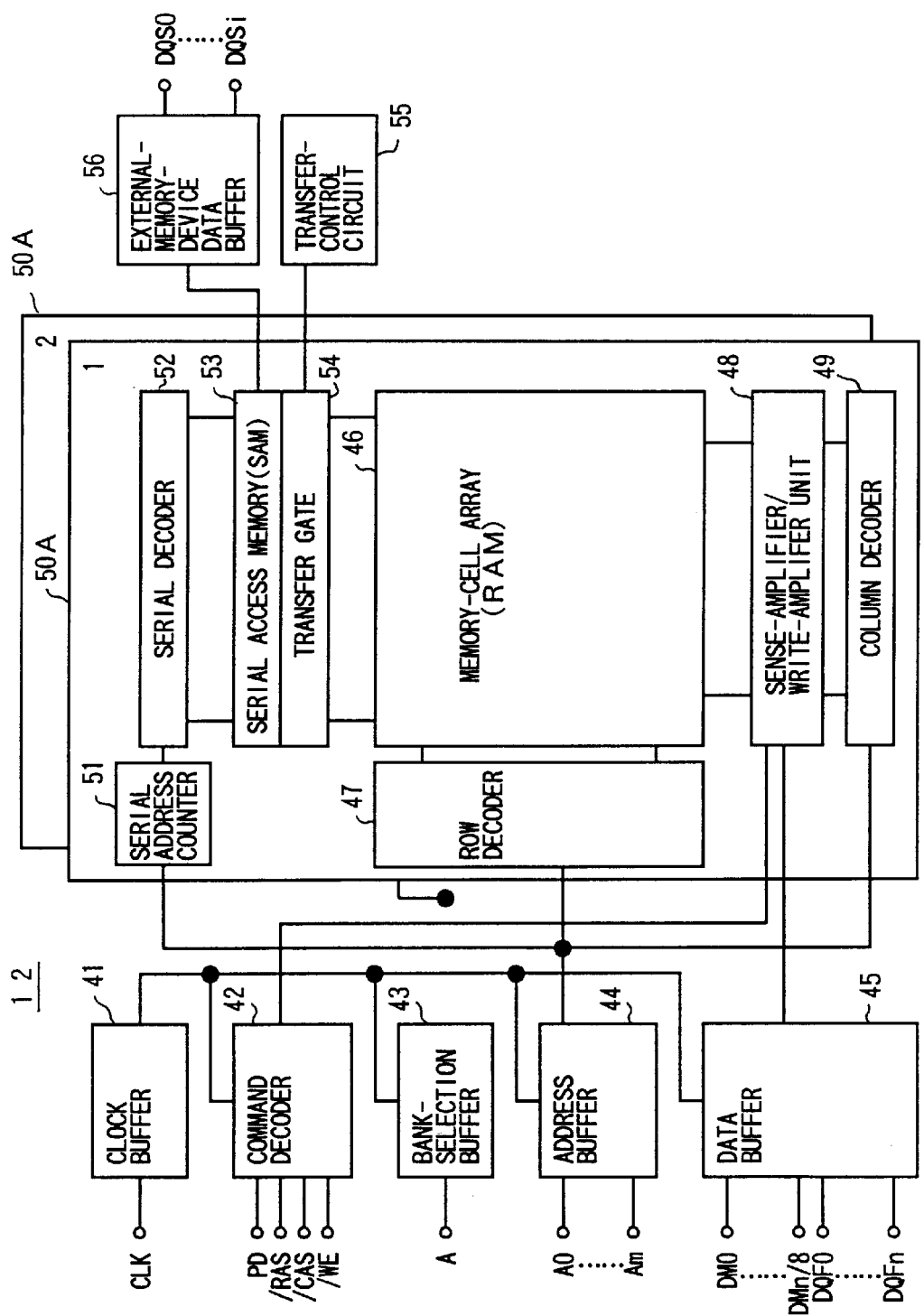
FIG. 8 is a block diagram showing an exemplary configuration of a memory chip which is provided with an external-memory-device-I/O unit.

FIG. 8 is a block diagram showing an exemplary configuration of the memory chip 12 which is provided with the external-memory-device-I/O unit 30. In FIG. 8, the same elements as those of FIG. 7 are referred to by the same numerals, and a description thereof will be omitted.

The memory chip 12 of FIG. 8 includes banks 50A replacing the banks 50 of the memory chip of FIG. 7, and further includes a transfer-control circuit 55 and an external-memory-device data buffer 56. Each of the banks 50A includes the memory-cell array 46, the row decoder 47, the sense-amplifier/write-amplifier unit 48, and the column decoder 49, which are the same as those of the banks 50 shown in FIG. 7, and further includes a serial address counter 51, a serial decoder 52, a serial access memory (SAM) 53, and a transfer gate 54. The serial address counter 51, the serial decoder 52, the serial access memory 53, and the transfer gate 54 are provided inside each of the banks 50A for the purpose of conducting serial data transfer between the memory chip 12 and an external memory device provided outside the semiconductor system 1 (FIG. 2). The external-memory-device data buffer 56 corresponds to the external-memory-device-I/O unit 30 of FIG. 2.

The serial address counter 51 successively generates consecutive addresses by counting up addresses based on an address supplied from the address buffer 44. The serial decoder 52 decodes addresses which are successively provided from the serial address counter 51, and supplies the decoded addresses to the serial access memory 53. In the case of data-write operations, data is supplied from an external source to the external-memory-device data buffer 56, and is successively written at consecutive addresses of the serial access memory 53. The transfer gate 54 is opened at timings controlled by the transfer-control circuit 55, so that the data in the serial access memory 53 is transferred to the memory-cell array 46. In the case of data-read operations, steps are performed in a reversed order in contrast to the data-write operations.

The configuration of the memory chip 12 of FIG. 8 is the same as that of a conventional dual-port memory or the like, and a detailed description of each element will be omitted.

Figure 9:
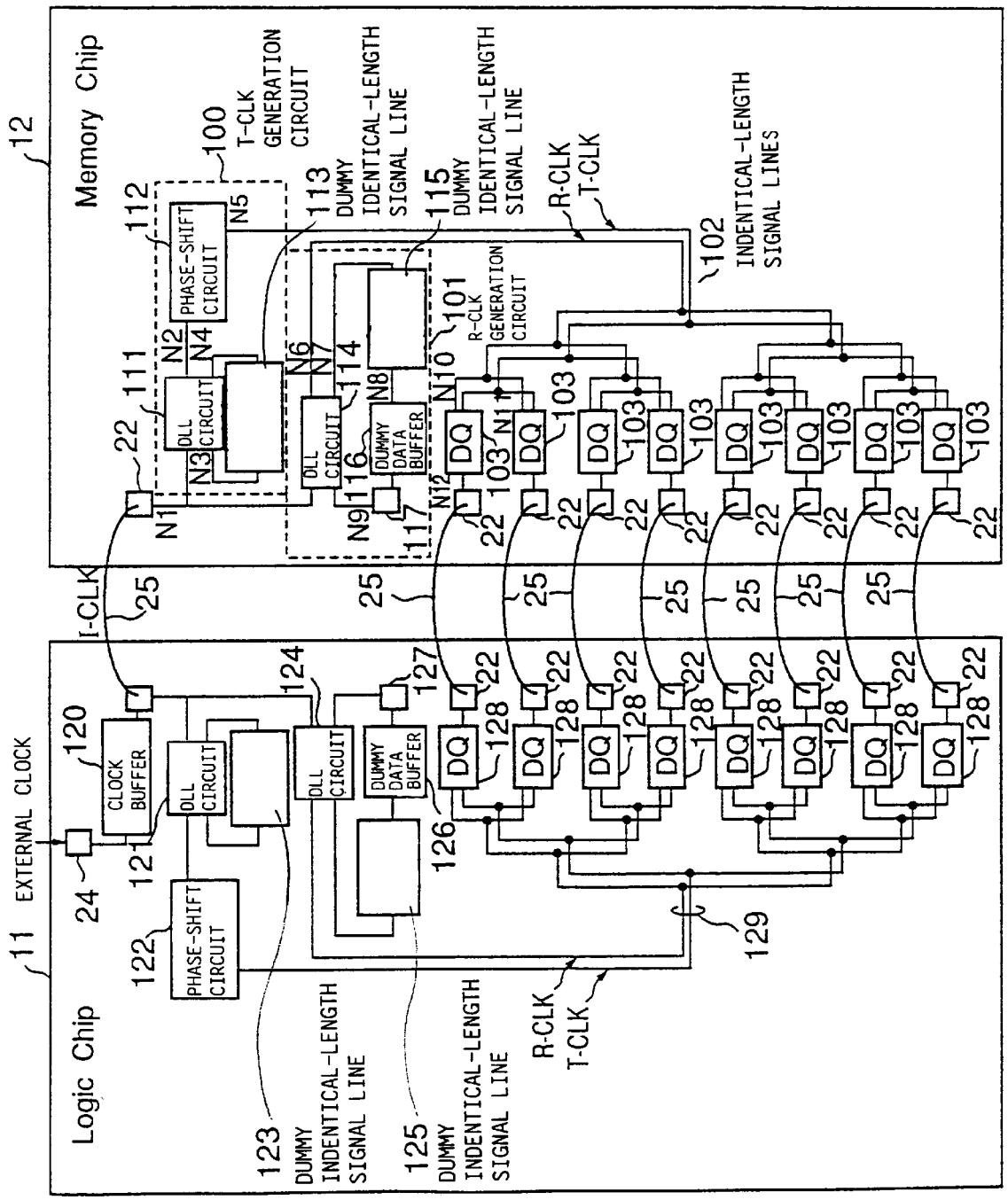
FIG. 9 is a block diagram of a memory-logic-I/O unit including the high-speed-I/O circuit shown in FIG. 2.

FIG. 9 is a block diagram of the memory-logic-I/O unit 20 including the high-speed-I/O circuit 21 shown in FIG. 2. In FIG. 9, the same elements as those of FIG. 2 are referred to by the same numerals, and a description thereof will be omitted.

The memory chip 12 includes a T-CLK generation circuit 100, a R-CLK generation circuit 101, a identical-length signal lines 102, and data buffers 103. The T-CLK generation circuit 100, the R-CLK generation circuit 101, the identical-length signal lines 102, and the data buffers 103 together make up the high-speed-I/O circuit 21. The high-speed-I/O circuit 21 and a plurality of the I/O pads 22 together form the memory-logic-I/O unit 20 of the memory chip.

The T-CLK generation circuit 100 generates a clock signal T-CLK used for data-write operations with regard to the memory chip 12. The generation of the clock signal T-CLK is based on a clock signal I-CLK supplied from the logic chip 11 to a node N1 (one of the I/O pads 22). The T-CLK generation circuit 100 includes a DLL (delay locked loop) circuit 111, a phase-shift circuit 112, and a dummy identical-length signal line 113. The DLL circuit 111 introduces a phase delay of approximately 360° to a signal N1 of the node N1 while taking into consideration signal delays as signals incur these delays when propagating through the identical-length signal lines 102 from the T-CLK generation circuit 100 to the data buffers 103. The phase-delayed signal N2 is further delayed by 180° with regard to a phase thereof by the phase-shift circuit 112, and, then, is supplied as the data-write-purpose clock signal T-CLK to the data buffers 103 via the identical-length signal lines 102. The dummy identical-length signal line 113 in the DLL circuit 111 is used for emulating an effect of phase delays caused by the identical-length signal lines 102.

FIGS. 10A through 10J are timing charts for explaining operations of the high-speed-I/O circuit 21 provided in the memory chip. In what follows, operations of the high-speed-I/O circuit 21 will be described with reference to FIG. 9 and FIGS. 10A through 10J.

Figure 10:
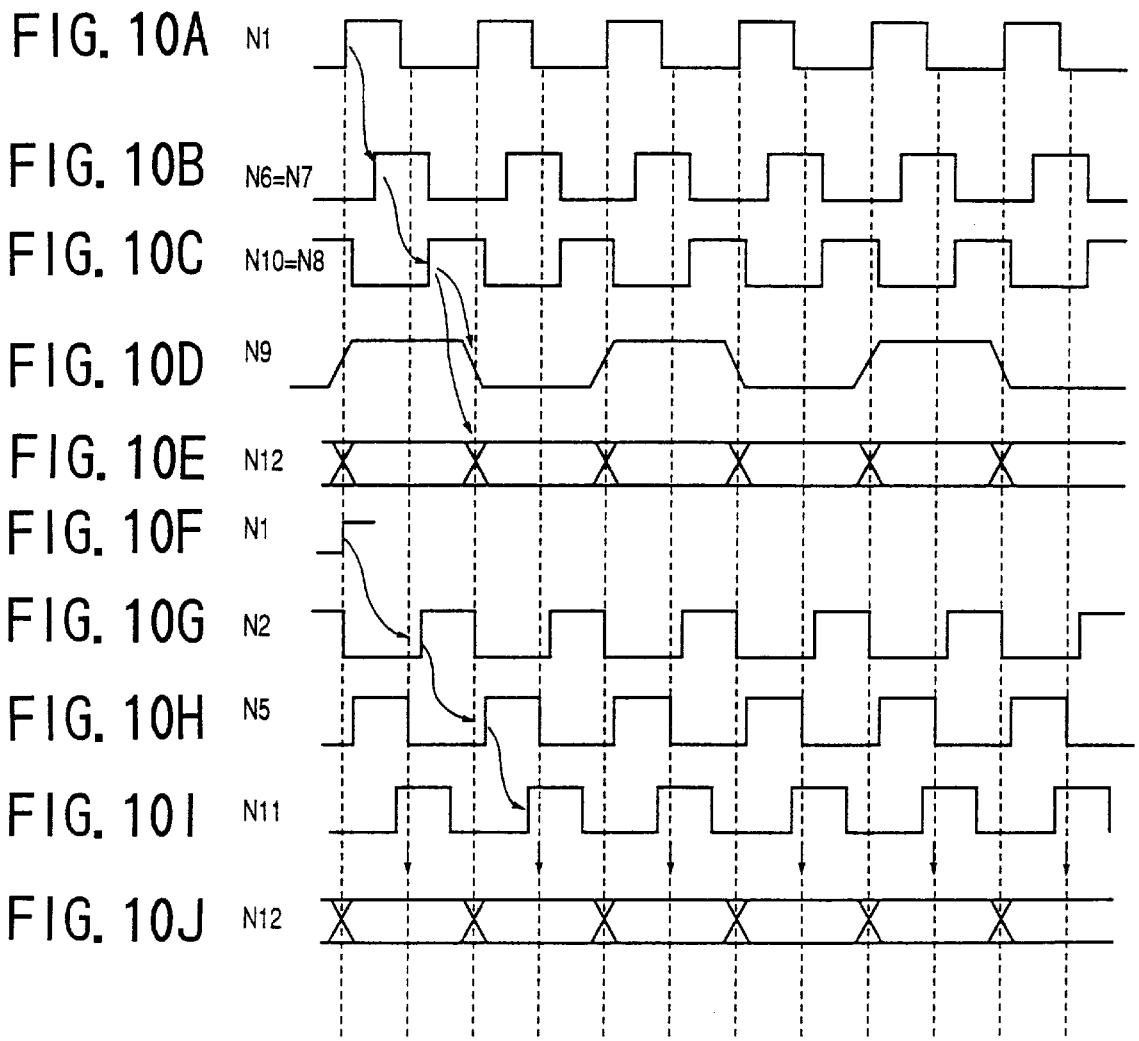
FIGS. 10A through 10J are timing charts for explaining operations of the high-speed-I/O circuit provided in the memory chip.

Assume that the identical-length signal lines 102 introduce a phase delay x. The DLL circuit 111 of the T-CLK generation circuit 100 generates a signal N4 which has the same phase as a signal N2. Having the signal N4 as an input, the dummy identical-length signal line 113 outputs a signal N3 having a phase delay x in comparison to the signal N2. The DLL circuit 111 adjusts the phase of the signal N4 such that the signal N3 and the signal N1 have the same phase. Because of this adjustment, the signal N2, which has the same phase as the signal N4, ends up being delayed by 360°-x in comparison to the signal N1 (clock signal I-CLK). The signal N1 and the signal N2 are shown in FIG. 10F and FIG. 10G, respectively. The signal N2 is delayed by 180° by the phase-shift circuit 112 to produce a signal N5 (FIG. 10H). The signal N5 is output from the T-CLK generation circuit 100, and propagates through the identical-length signal lines 102 to reach the data buffers 103 as a signal N11. As shown in FIG. 10I, the signal N11 has exactly a 180°-phase difference in comparison with the clock signal I-CLK (signal N1) after experiencing the phase delay x through the identical-length signal lines 102.

The logic chip 11 supplies data signals having the same phase as the clock signal I-CLK to the memory chip 12. A signal N12 supplied to a node N12 (one of the I/O pads 22) of the memory chip 12 is shown in FIG. 10J. The signal N11 (FIG. 10I), which is supplied to the data buffers 103, has exactly a 180°-phase difference with the signal N12, so that use of the signal N11 as a synchronization signal for reading data makes it possible to read the data exactly at midpoint of a data-valid period of the signal N12. Because of this, reliable data-write operations can be achieved even when a frequency of the clock signal is high.

The R-CLK generation circuit 101 generates a clock signal R-CLK used for data-read operations with regard to the memory chip 12. The generation of the clock signal R-CLK is based on the clock signal I-CLK supplied from the logic chip 11 to the node N1 (one of the I/O pads 22). The R-CLK generation circuit 101 includes a DLL circuit 114, a dummy identical-length signal line 115, a dummy data buffer 116, and a dummy node 117. The DLL circuit 114 introduces a phase delay of approximately 360° to the signal N1 of the node N1 while taking into consideration signal delays incurred between the R-CLK generation circuit 101 and the I/O pads 22. A phase-delayed signal N6 is supplied as the data-read-purpose clock signal R-CLK to the data buffers 103 via the identical-length signal lines 102. The dummy identical-length signal line 115 in the DLL circuit 114 is used for emulating an effect of phase delays caused by the identical-length signal lines 102. Further, the dummy data buffer 116 and the dummy node 117 are used for emulating delays of the data buffers 103 and the I/O pads 22, respectively.

Assume that the identical-length signal lines 102, the data buffers 103, and the I/O pads 22 introduce a total phase delay x. The DLL circuit 114 of the R-CLK generation circuit 101 generates a signal N7 which has the same phase as a signal N6. Having the signal N7 as an input, a series of the dummy identical-length signal line 115, the dummy data buffer 116, and the dummy node 117 outputs a signal N9 having a phase delay y in comparison to the signal N7. The DLL circuit 114 adjusts the phase of the signal N7 such that the signal N9 and the signal N1 have the same phase. Because of this adjustment, the signal N6, which has the same phase as the signal N7, ends up being delayed by 360°-y in comparison to the signal N1 (clock signal I-CLK). The signal N1 and the signal N6 (=N7) are shown in FIG. 10A and FIG. 10B, respectively. The signal N6 is delayed through the identical-length signal lines 102 to produce a signal N10 (=N8, FIG. 10C). The signal N10 is used as a synchronization signal in the data buffers 103, so that the data buffers 103 supply a signal N12 (FIG. 10E) to the I/O pads 22. Since the signal N12 has a phase delay y in comparison with the signal N6, and, thus, has the same phase as the signal N9 shown in FIG. 10D. The signal N9 is in line with the clock signal I-CLK (signal N1) in terms of a phase thereof, so that the signal N12 output from the I/O pads 22 ends up having the same phase as the clock signal I-CLK.

As described above, the use of the R-CLK generation circuit 101 makes it possible to read data from the memory chip 12 in the same phase relation with the clock signal I-CLK supplied from the logic chip 11.

In FIG. 9, the logic chip 11 includes a clock buffer 120, a DLL circuit 121, a phase-shift circuit 122, a dummy identical-length signal line 123, a DLL circuit 124, a dummy identical-length signal line 125, a dummy data buffer 126, a dummy node 127, and a dummy identical-length signal line 125. The clock buffer 120 receives the clock signal CLK from an external source via the connection pad 24, and outputs the clock signal I-CLK. The clock signal I-CLK is supplied to the memory chip 12 via the I/O pads 22, and is also directed to the internal elements of the logic chip 11. In FIG. 9 which shows the memory-logic-I/O units 20, elements of the logic chip 11 other than the a clock buffer 120 are the same as those of the memory chip 12, and, also, the data-read operations and the data-write operations are identical between these chips. In order to avoid a repetition of what has been already described, a description thereof will be omitted.

Figure 11:
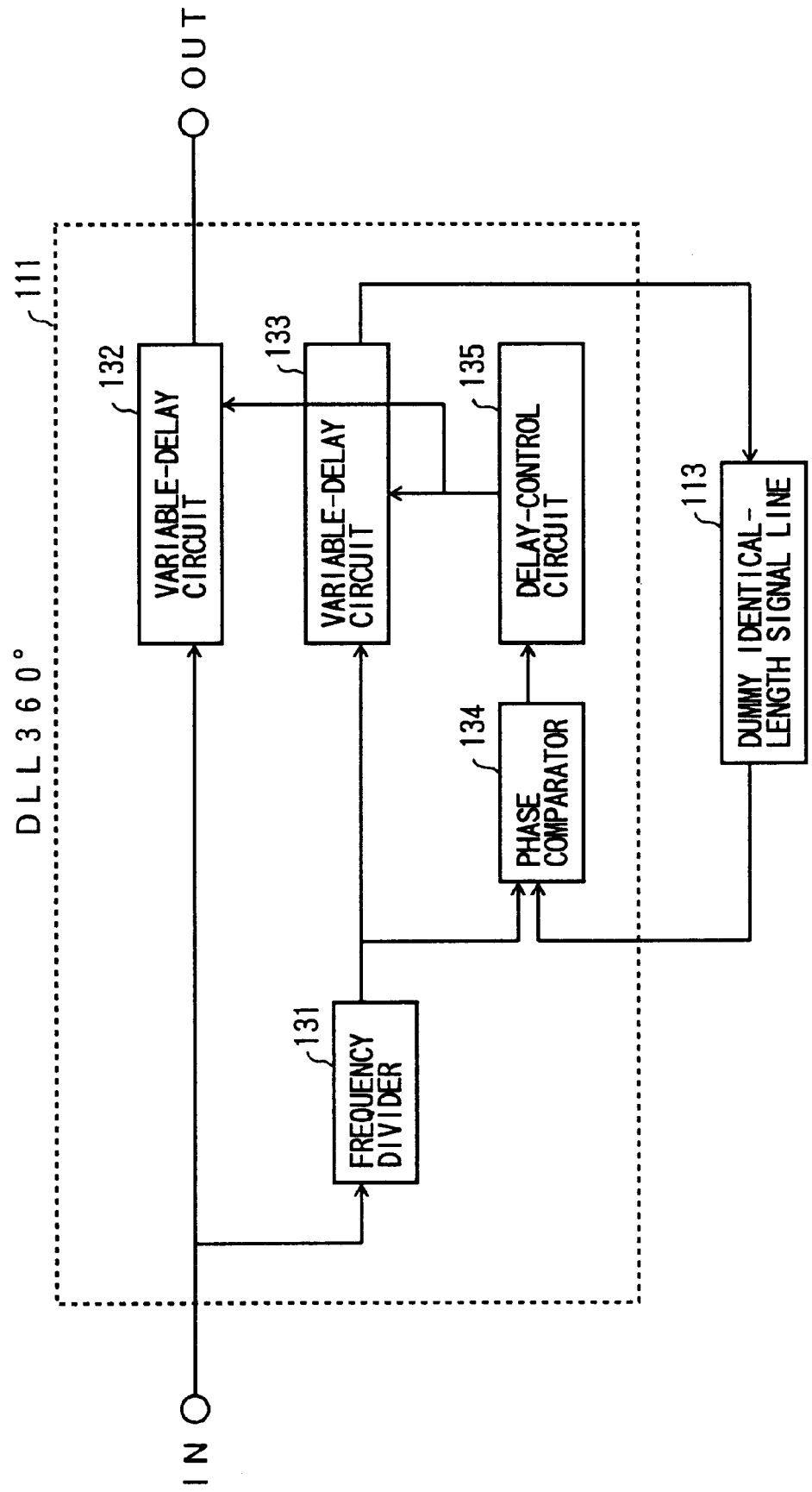
FIG. 11 is a block diagram of a DLL circuit.

FIG. 11 is a block diagram of the DLL circuit 111.

As shown in FIG. 11, the DLL circuit 111 includes a frequency divider 131, variable-delay circuits 132 and 133, a phase comparator 134, and a delay-control circuit 135. A signal supplied to a node IN is subjected to frequency division by the frequency divider 131, and is converted into a frequency-divided signal which is suitable for phase comparison. The frequency-divided signal from the frequency divider 131 is delayed by the variable-delay circuit 133, and is further delayed by the dummy identical-length signal line 113 before being supplied to the phase comparator 134. The phase comparator 134 compares the frequency-divided signal directly supplied from the frequency divider 131 with the delayed frequency-divided signal supplied from the dummy identical-length signal line 113 in terms of their phases, and controls the delay-control circuit 135 such that the phases of these two signals become identical. Under this control, the delay-control circuit 135 adjusts the delay of the variable-delay circuit 133.

The signal supplied to the node IN is also delayed by the variable-delay circuit 132, and, then, is output from a node OUT. The delay of the variable-delay circuit 132 is adjusted to the same delay as that of the variable-delay circuit 133 by the delay-control circuit 135. Denoting the delay of the dummy identical-length signal line 113 as x, the phase delay of the variable-delay circuit 133 is adjusted to 360°-x. Accordingly, the signal output from the node OUT also has a phase delay of 360°-x compared to the signal input to the node IN.

Figure 12:
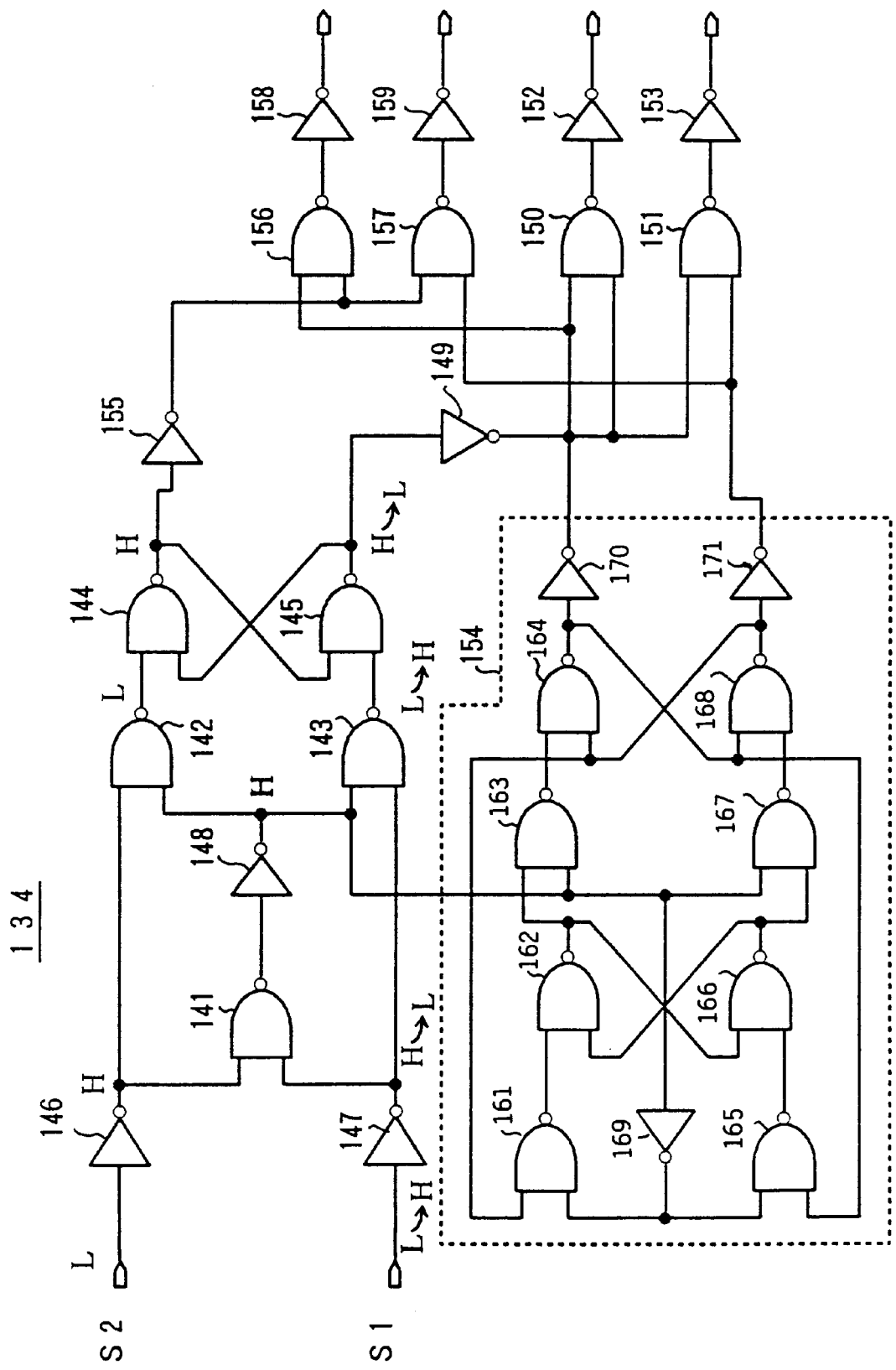
FIG. 12 is a circuit diagram showing an example of a circuit structure of a phase comparator.

FIG. 12 is a circuit diagram showing an example of a circuit structure of the phase comparator 134. Signals S1 and S2 input to the phase comparator 134 correspond to the frequency-divided signal from the frequency divider 131 and the delayed frequency-divided signal from the dummy identical-length signal line 113 shown in FIG. 11.

The phase comparator 134 includes NAND circuits 141 through 145, inverters 146 through 149, NAND circuits 150 and 151, inverters 152 and 153, a binary counter 154, an inverter 155, NAND circuits 156 and 157, and inverters 158 and 159. The NAND circuits 144 and 145 together form a latch. This latch has two LOW inputs and two HIGH outputs in an initial condition as shown in FIG. 12. When a rising edge of the signal S1 is ahead of a rising edge of the signal S2, the output of the NAND circuit 143 becomes HIGH ahead of the output of the NAND circuit 142. The output of the NAND circuit 145 thus becomes LOW, while the NAND circuit 144 keeps the HIGH output thereof. This condition is latched by the latch, and, thus, does not change even when the output of the NAND circuit 142 is turned to HIGH by the rising edge of the signal S2. As a result, an output of the inverter 149 is HIGH when the signal S1 has a phase which is ahead in time. Conversely, when the phase of the signal S2 is ahead in time, an output of the inverter 155 becomes HIGH.

A signal from the inverter 148 serves to bring the latch to the initial condition at an appropriate timing by simultaneously turning the outputs of the NAND circuits 142 and 143 to LOW. If this configuration was not in place, the outputs of the NAND circuits 143 and 142 would become HIGH successively in this order when the phase of the signal S1 was ahead in time, and, then, the condition of the latch would be reversed when the signal S1 became LOW ahead of the signal S2, thereby providing a LOW output from the NAND circuit 144. In order to avoid this, the outputs of the NAND circuits 142 and 143 are changed to LOW at the same time.

The output of the inverter 148 is also provided to the binary counter 154. The binary counter 154 has two outputs which become HIGH in turn at every cycle of the input frequency-divided signals S1 and S2. The binary counter 154 includes NAND circuits 161 through 168 and inverters 169 through 171. Operations of the binary counter 154 are well within the scope of ordinary skill in the art, and a description thereof will be omitted.

The two outputs of the binary counter 154 are supplied to one of the two inputs of the NAND circuits 150 and 151, respectively. The other input of the NAND circuits 150 and 151 receives the output of the inverter 149. Further, the two outputs of the binary counter 154 are supplied to one of the two inputs of the NAND circuits 156 and 157, respectively. The other input of the NAND circuits 156 and 157 receives the output of the inverter 155.

Accordingly, when the signal S1 has a phase ahead of the phase of the signal S2, the inverters 152 and 153, which invert outputs of the NAND circuits 150 and 151, respectively, provide HIGH pulses in turn. On the other hand, when the phase of the signal S2 is ahead in time, the inverters 158 and 159, which invert outputs of the NAND circuits 156 and 157, respectively, provide HIGH pulses in turn.

The HIGH pulses output from the inverters 152 and 153 or the inverters 158 and 159 in turn are supplied to the delay-control circuit 135 of FIG. 11, thereby adjusting the delays of the variable-delay circuits 132 and 133.

Figure 13:
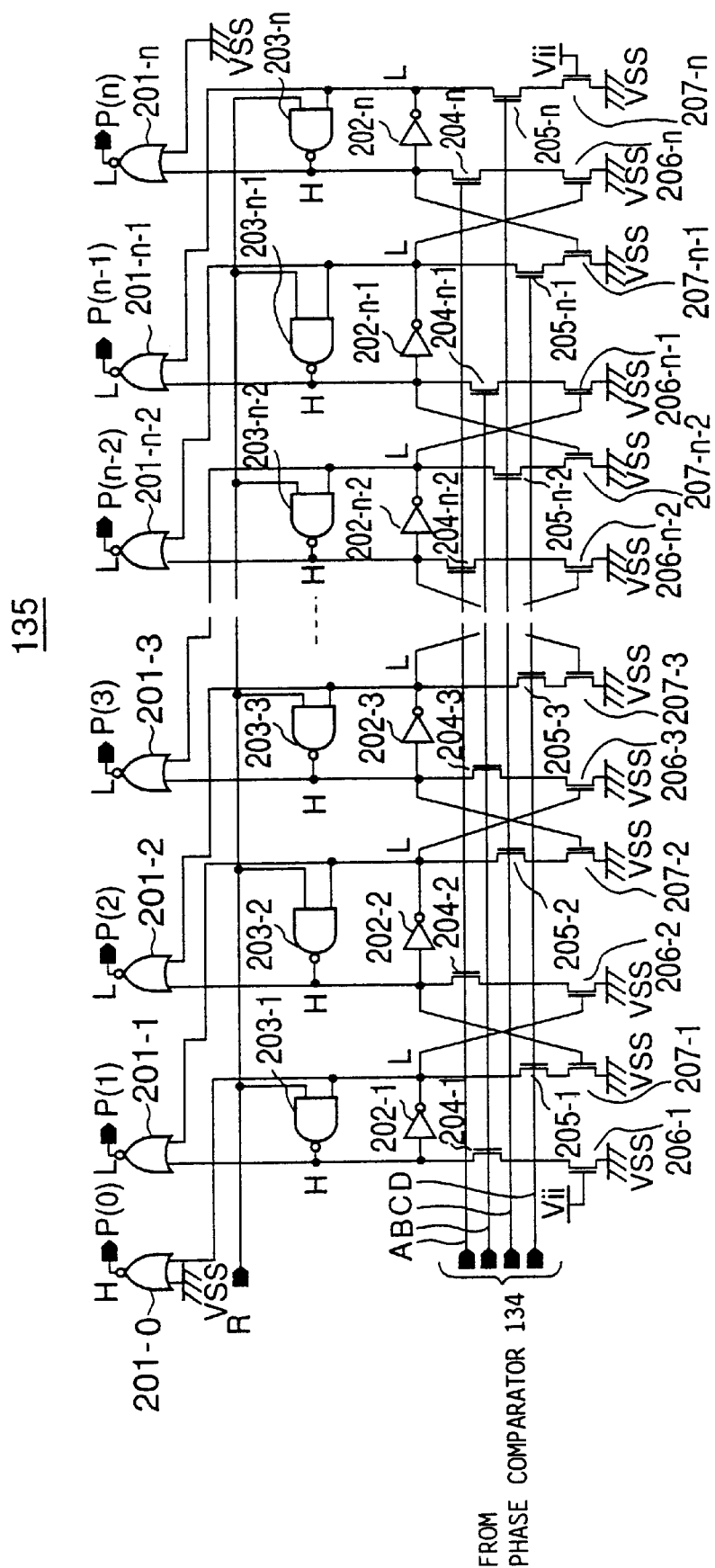
FIG. 13 is a circuit diagram showing an example of a circuit structure of a delay-control circuit.

FIG. 13 is a circuit diagram showing an example of a circuit structure of the delay-control circuit 135.

The delay-control circuit 135 includes NOR circuits 201-0 through 201-n, inverters 202-1 through 202-n, NAND circuits 203-1 through 203-n, NMOS transistors 204-1 through 204-n, NMOS transistors 205-1 through 205-n, NMOS transistors 206-1 through 206-n, and NMOS transistors 207-1 through 207-n. When a reset signal R is turned to LOW, the delay-control circuit 135 is reset. Namely, when the reset signal R becomes LOW, outputs of the NAND circuits 203-1 through 203-n become HIGH, and outputs of the inverters 202-1 through 202-n become LOW. A pair of a given one of the NAND circuits 203-1 through 203-n and a corresponding one of the inverters 202-1 through 202-n forms a latch in which one element of the pair receives an output of the other element as an input. An initial state created by the reset signal R is thus kept even after the reset signal R returns to HIGH.

In this initial state, an output P(0) of the NOR circuit 201-0 is HIGH as shown in FIG. 13, and the remaining NOR circuits 201-1 through 201-n have outputs P(1) through P(n), respectively, which are LOW. That is, only the output P(0) is HIGH among the outputs P(0) through P(n).

When there is a need to increase the amount of delay, HIGH pulses are supplied to signal lines A and B in turn. With a HIGH pulse supplied to the signal line B, the NMOS transistor 204-1 is turned on. Since the NMOS transistor 206-1 is in a turned-on state, an output of the NAND circuit 203-1 is connected to the ground, and is forced to change from HIGH to LOW, so that an output of the inverter 202-1 becomes HIGH. This condition is latched by the latch comprising the NAND circuit 203-1 and the inverter 202-1. As a result, the output P(0) is changed from HIGH to LOW, while the output P(1) is turned from LOW to HIGH. In this condition, therefore, only the output P(1) is HIGH.

With a HIGH pulse supplied to the signal line A, the NMOS transistor 204-2 is turned on. Since the NMOS transistor 206-2 is already in a turned-on state, an output of the NAND circuit 203-2 is connected to the ground, and is forced to change from HIGH to LOW, so that an output of the inverter 202-2 becomes HIGH. This condition is latched by the latch comprising the NAND circuit 203-2 and the inverter 202-2. As a result, the output P(1) is changed from HIGH to LOW, while the output P(2) is turned from LOW to HIGH. In this condition, therefore, only the output P(2) is HIGH.

As described above, HIGH pulses are supplied in turn to the signal lines A and B to shift the only one HIGH output among the outputs P(0) through P(n) to the right.

When there is a need to decrease the delay amount, HIGH pulses are supplied to signal lines C and D in turn. Operations in this case are simply a reverse of the above-described operations, and a description thereof will be omitted.

When HIGH pulses are supplied to the signal lines C and D in turn, the only one HIGH output among the outputs P(0) through P(n) will be shifted one by one to the left.

The output signals P(1) through P(n) are supplied to the variable-delay circuits 132 and 133 shown in FIG. 11 so as to adjust a delay of signals.

Figure 14:
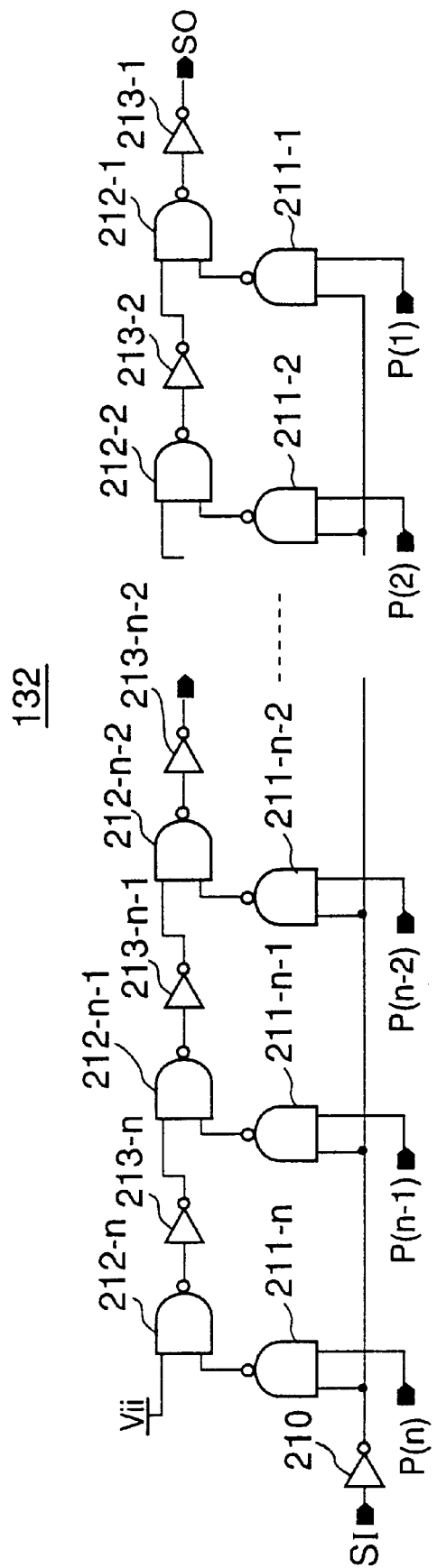
FIG. 14 is a circuit diagram showing an example of a circuit structure of a variable-delay circuit.

FIG. 14 is a circuit diagram showing an example of a circuit structure of the variable-delay circuit 132. A circuit configuration of the variable-delay circuit 133 is the same as that of the variable-delay circuit 132.

The variable-delay circuit 132 includes an inverter 210, NAND circuits 211-1 through 211-n, NAND circuits 212-1 through 212-n, and inverters 213-1 through 213-n. The NAND circuits 212-1 through 212-n and the inverters 213-1 through 213-n together form a delay line (a series of delay elements).

The NAND circuits 211-1 through 211-n have one input for receiving an inverse of an input signal S1 from the inverter 210, and have the other input which is provided with the signals P(1) through P(n), respectively. The only one HIGH signal among the signals P(1) through P(n) is denoted as P(x).

The NAND circuits 211-1 through 211-n, except for the NAND circuit 211-x, have one input which is LOW, and, thus, have a HIGH output. The NAND circuits 212-1 through 212-n, except for the NAND circuit 212-x, receive this HIGH output at one input thereof, thereby serving as an inverter to the other output thereof.

Accordingly, a portion of the delay line which is situated upstream from the NAND circuit 212-x allows a fixed HIGH level to propagate therethrough when this fixed HIGH level is supplied to one input of the NAND circuit 212-n. The NAND circuit 212-x thus receives the fixed HIGH level at one input thereof. The other input of the NAND circuit 212-x receives the input signal SI via the inverter 210 and the NAND circuit 211-x. Another portion of the delay line from the NAND circuit 212-x to the inverter 213-1 allows the input signal SI to propagate therethrough with some delays, thereby generating a delayed signal as an output signal SO. The output signal SO in this case is delayed by a delay amount commensurate with x stages of delay elements in comparison with the input signal S1.

As described above, the phase comparator 134 of FIG. 12 compares phases of the frequency-divided signals, and the delay-control circuit 135 of FIG. 13 controls a position of the only one HIGH signal among the signals P(1) through P(n) based on comparison results of the phase comparator 134. The signals P(1) through P(n) set the delay amount of the variable-delay circuit 132 (133) shown in FIG. 14. In this manner, the DLL circuit 111 of FIG. 11 generates a signal having a desired delay.

Figure 15:
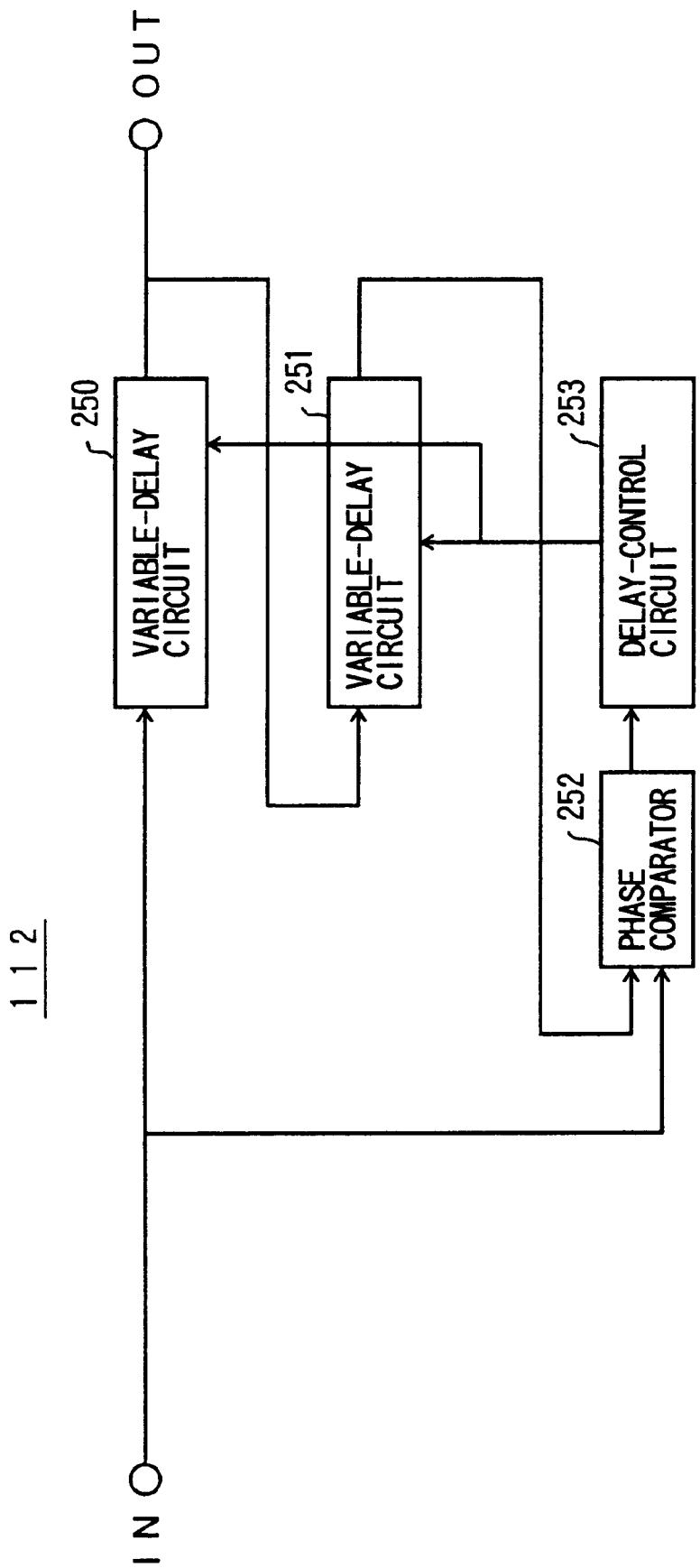
FIG. 15 is a block diagram of a phase-shift circuit shown in FIG. 9.

FIG. 15 is a block diagram of the phase-shift circuit 112 shown in FIG. 9.

As shown in FIG. 15, the phase-shift circuit 112 includes variable-delay circuits 250 and 251, a phase comparator 252, and a delay-control circuit 253.

A signal supplied to an input node IN is delayed by the variable-delay circuit 250 by a delay T. A signal having the delay T output from the variable-delay circuit 250 is further delayed by the same delay T by the variable-delay circuit 251. A signal having the delay 2T output from the variable-delay circuit 251 is compared with the signal supplied to the input node IN in terms of their phases by the phase comparator 252. The phase comparator 252 controls the delay T of the variable-delay circuits 250 and 251 via the delay-control circuit 253 such that the compared two signals have the same phase.

As a result, the delay of the variable-delay circuits 250 and 251 will be adjusted such that the delay 2T is equal to 360° in a phase term. In this manner, an output node of the phase-shift circuit 112 provides a signal which is delayed by 180° in comparison with the input signal. Here, the variable-delay circuits 250 and 251, the phase comparator 252, and the delay-control circuit 253 have configurations identical to those of the variable-delay circuits 132 and 133, the phase comparator 134, and the delay-control circuit 135 of the DLL circuit 111, respectively.

It should be noted that the phase-shift circuit 112 may be a fixed-delay circuit for delaying a signal by a fixed delay in a case where a signal frequency is fixed.

Figure 16:
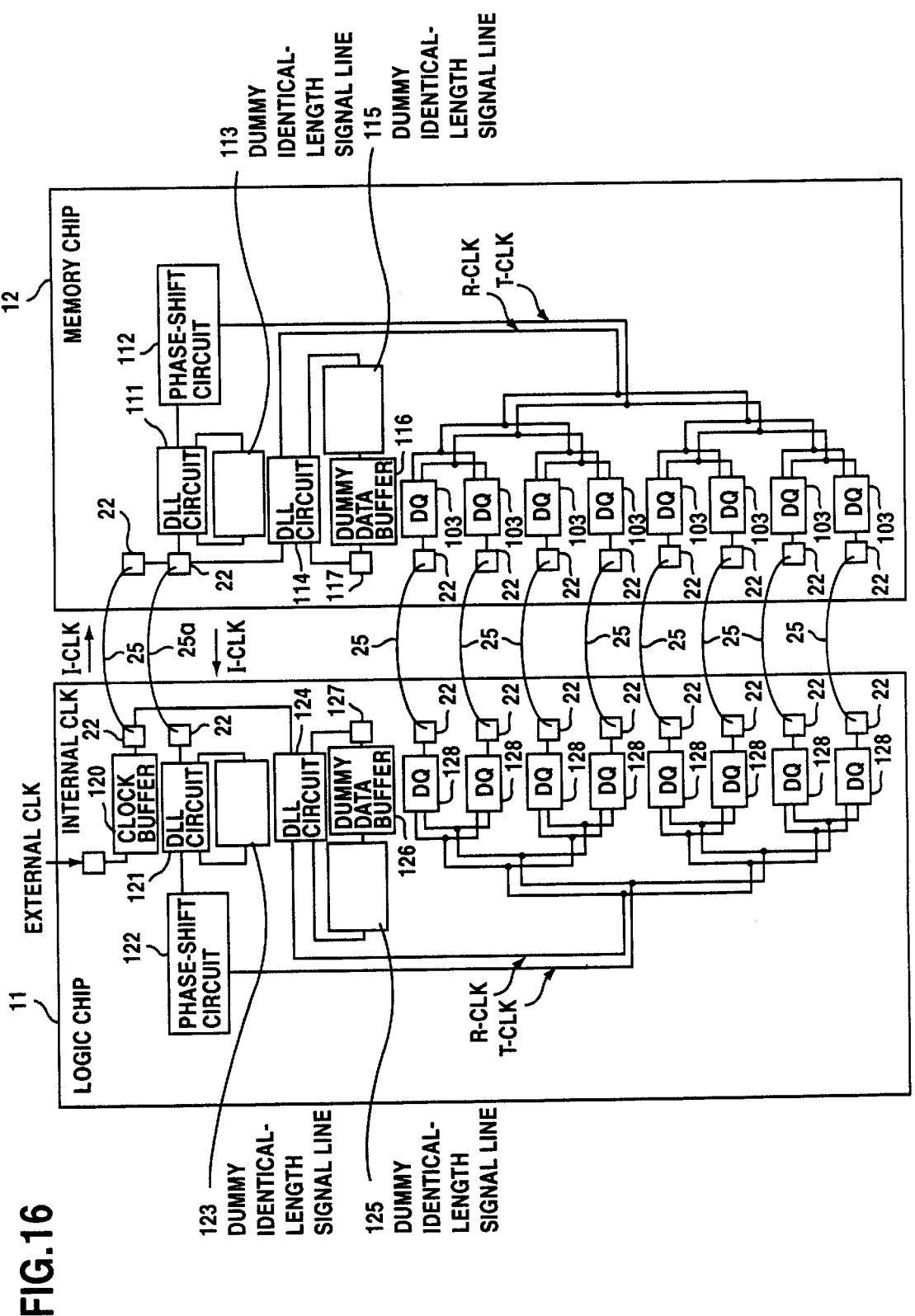
FIG. 16 is a block diagram showing another configuration of the memory-logic-I/O unit of the logic chip and the memory chip.

FIG. 16 is a block diagram showing another configuration of the memory-logic-I/O unit 20 of the logic chip 11 and the memory chip 12. In FIG. 16, the same elements as those of FIG. 9 are referred to by the same numerals, and a description thereof will be omitted.

In comparison with a configuration of FIG. 9, a configuration of FIG. 16 includes an additional structure which conveys the clock signal I-CLK back from the memory chip 12 to the logic chip 11 via a wire bonding 25a after the clock signal I-CLK is supplied from the logic chip 11 to the memory chip 12. The clock signal I-CLK conveyed back from the memory chip 12 is used to generate a clock signal T-CLK in the logic chip 11 for the purpose of receiving data which is read from the memory chip 12.

The configuration of FIG. 9 is based on an underlying assumption that the wire bonding 25 between the logic chip 11 and the memory chip 12 introduce no delay or only a negligible delay to signal propagation. The configuration of FIG. 16, on the other hand, achieves a reliable data transfer by conveying the clock signal I-CLK back to the logic chip 11 even when there is a non-negligible delay in the wire bonding 25.

A signal delay by the wire bonding 25 or the wire bonding 25a is hereinafter denoted as T1. The clock signal I-CLK supplied from the logic chip 11 to the memory chip 12 incurs a delay Ti owing to the wire bonding 25. When data is written in the memory chip 12, data signals supplied from the logic chip 11 to the memory chip 12 are also delayed by the delay T1 via the wire bonding 25. Because of this, when the clock signal T-CLK for data writing is obtained from the clock signal I-CLK having the delay T1, the clock signal T-CLK can be used perfectly well in the memory chip 12 for receiving the data having the delay T1.

As for data read from the memory chip 12 in synchronism with the clock signal I-CLK having the delay T1, however, this data is further delayed by a delay T1 before arriving at the logic chip 11. In comparison with the clock signal I-CLK having no delay, the data reaching the logic chip 11 has a delay 2T1. Consequently, if the data having the delay 2T1 is received by the logic chip 11 using the clock signal T-CLK obtained from the clock signal I-CLK having no delay, no synchronization can be established with regard to the received data.

In the configuration of FIG. 16, the clock signal I-CLK transmitted from the logic chip 11 to the memory chip 12 is sent back to the logic chip 11 via the wire bonding 25a, so that the clock signal I-CLK having the delay 2T1 can be obtained. The logic chip 11 obtains the clock signal T-CLK from the clock signal I-CLK having the delay 2T1, and uses the clock signal T-CLK as a synchronization signal for receiving data having the delay 2T1 when this data is sent from the memory chip 12. This configuration can achieve a reliable high-speed data transfer even when the signal delay between the logic chip 11 and the memory chip 12 is not negligible.

Figure 17B:
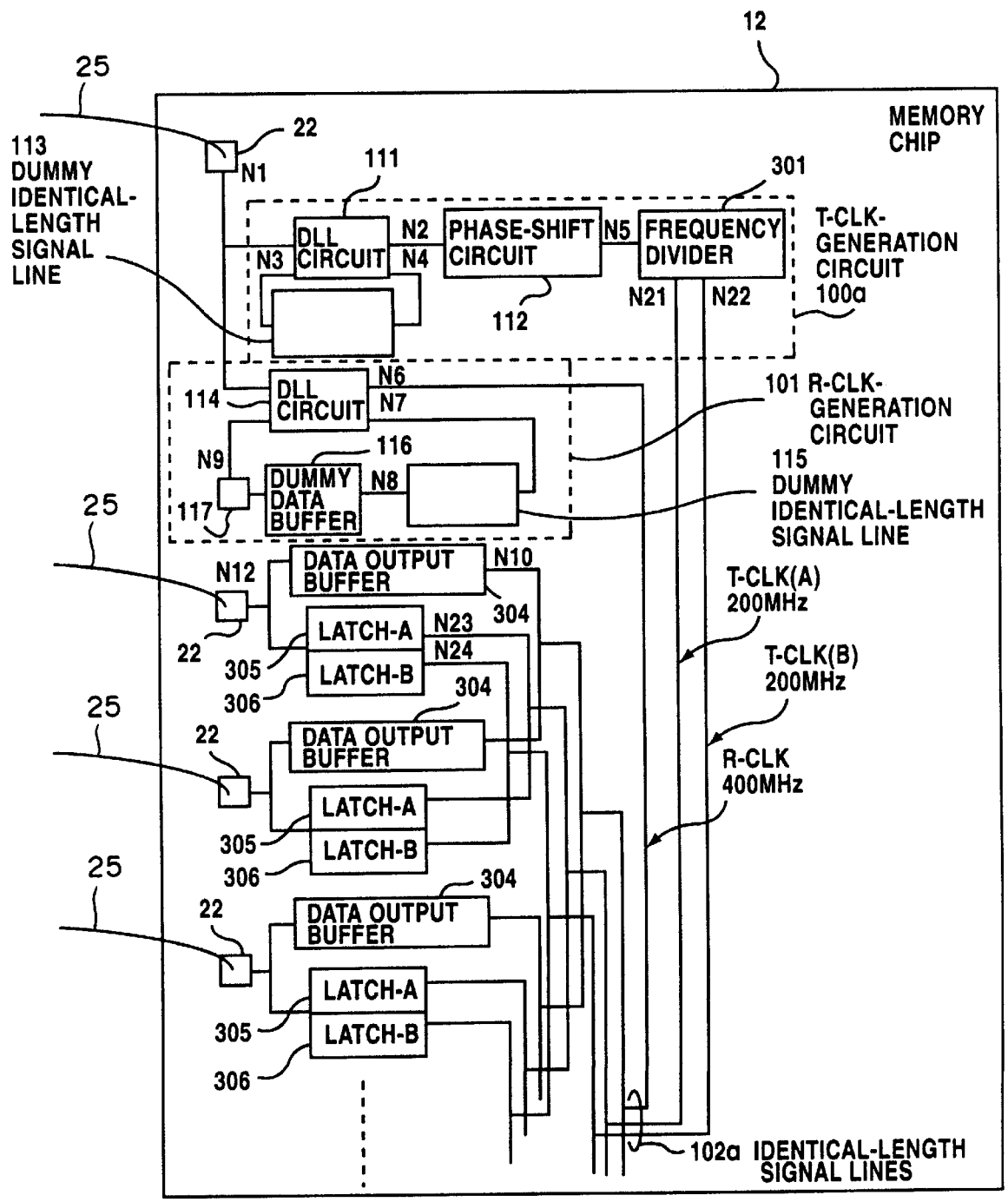
FIG. 17 is a block diagram showing yet another configuration of the memory-logic-I/O unit of the logic chip and the memory chip.

FIG. 17 is a block diagram showing yet another configuration of the memory-logic-I/O unit 20 of the logic chip 11 and the memory chip 12. In FIG. 17, the same elements as those of FIG. 9 are referred to by the same numerals, and a description thereof will be omitted.

In a configuration of FIG. 17, the clock signal T-CLK for the data-write purposes used in the configuration of FIG. 9 is subjected to ½-frequency division by a frequency divider to generate a clock signal T-CLK(A) and T-CLK(B). The clock signal T-CLK(A) and T-CLK(B) are then used in data-write operations to receive data from the external source.

Data received in this manner changes a signal level thereof in synchronism with half a frequency of the clock signal I-CLK, so that an operation frequency of internal circuits can be lowered to half in the logic chip 11 and the memory chip 12. Namely, the logic chip 11 and the memory chip 12 can be operated at a conventionally viable speed, yet a clock having a frequency higher than the operation frequency of the internal circuits can be used to achieve a high-speed data transfer between the logic chip 11 and the memory chip 12. In this manner, the feature of the high-speed data transfer can be fully extended in a configuration where the logic chip 11 and the memory chip 12 implemented in the package 10 have the I/O pads 22 connected with each other via the wire bonding 25 as shown in FIG. 2.

In the memory chip 12, a frequency divider 301 of a T-CLK generation circuit 100a divides a frequency of a signal N5 (clock signal T-CLK) by half. The frequency-divided clock signal T-CLK(A) is supplied to latch-As 305 via identical-length signal lines 102a. Further, the frequency-divided clock signal T-CLK(B) is supplied to latch-Bs 306 via identical-length signal lines 102a. The latch-As 305 and the latch-Bs 306 are used for receiving data from the logic chip 11. For data-transmission purposes, data-output buffers 304 are used.

FIG. 18A through 18J are timing charts for explaining operations of the memory chip 12.

As shown in the figures, clock signals N21 and N22 having half the frequency are generated, and are delayed by the identical-length signal lines 102a to become clock signals N23 and N24, respectively. The clock signals N23 and N24 are used to receive a data signal N12. In this manner, the data received by the latch-As 305 and the latch-Bs 306 exhibit changes in signal levels thereof at half the frequency rate of the clock signal I-CLK (signal N1).

In the examples of FIG. 17 and FIGS. 18A through 18J, the frequency divider 301 performs ½-frequency division. Alternately, the frequency divider 301 may generate N clock signals having 360°/N-phase intervals therebetween by performing 1/N-frequency division. In this case, latches for receiving data are provided in a total of N latches for each of the I/O pads 22.

With reference to FIG. 17 again, a frequency divider 302 in the logic chip 11 divides a frequency of a signal N5' (clock signal T-CLK) by half. Operations of data receipt and data transmission are the same as those of the memory chip 12, and a description thereof will be omitted.

The logic chip 11 of FIG. 17 further includes a PLL circuit 303. The PLL circuit 303 performs frequency multiplication of the clock signal CLK externally supplied via the connection pad 24 so as to generate the clock signal I-CLK having a higher frequency. The clock signal CLK externally provided must be supplied via a bus to the semiconductor system 1 of FIG. 2. Because of this, the clock signal CLK cannot have a signal frequency as high as desirable. In the configuration of FIG. 17, however, the clock signal I-CLK having a higher frequency is generated inside the semiconductor system 1, and is used for high-speed data transfer between the logic chip 11 and the memory chip 12. Here, a circuit configuration of the PLL circuit 303 is well within the scope of ordinary skill in the art, and a description thereof will be omitted.

In the configurations of FIG. 9, FIG. 16, and FIG. 17, the logic chip 11 receives the clock signal CLK from an external source. Alternately, the memory chip 12 may receive the clock signal CLK from the external source instead of the logic chip 11.

Figure 19:
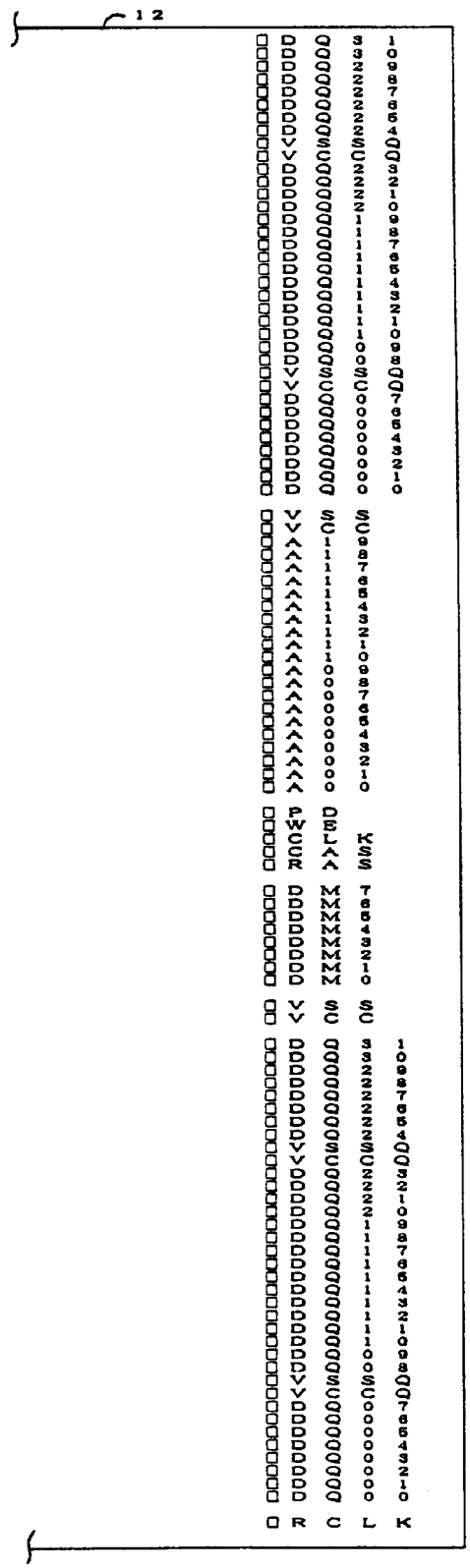
FIG. 19 is an illustrative drawing showing an example of I/O pads which are arranged along one side of the memory chip facing a corresponding side of the logic chip.

FIG. 19 is an illustrative drawing showing an example of the I/O pads 22 which are arranged along one side of the memory chip 12 facing a corresponding side of the logic chip 11.

When the memory chip 12 is of $2^M$ bits×N words×$2^L$ banks, the I/O pads 22 includes a clock-input node (or clock-output node) CLK, M address-signal nodes A00 through A19 inclusive of L bank-selection-signal nodes, N data-input/output nodes DQ00 through DQ31, three command-selection nodes WE, CAS, and RAS, a power-down-signal node PD, DM-signal nodes DM0 through DM7 provided for a unit of a byte, and power-voltage nodes VSS, VCC, VSSQ, and VCCQ. Further, the memory chip 12 may include a clock-return node RCLK for sending a received clock signal back to the logic chip 11 (or receiving a transmitted clock signal back from the logic chip 11). Here, signals supplied to the DM-signal nodes DM0 through DM7 are used for masking data byte-wise so that a masked data portion is not written.

Some of the power-voltage nodes VSS, VCC, VSSQ, and VCCQ may be dedicated power-voltage nodes used only by the DLL circuits 111, 114, 121, and 124 and/or the PLL circuit 303. Operations of the DLL/PLL circuits are sensitive to external disturbances. If dedicated power voltages are provided for the DLL/PLL circuits, a reliable clock control can be attained.

Figure 20:
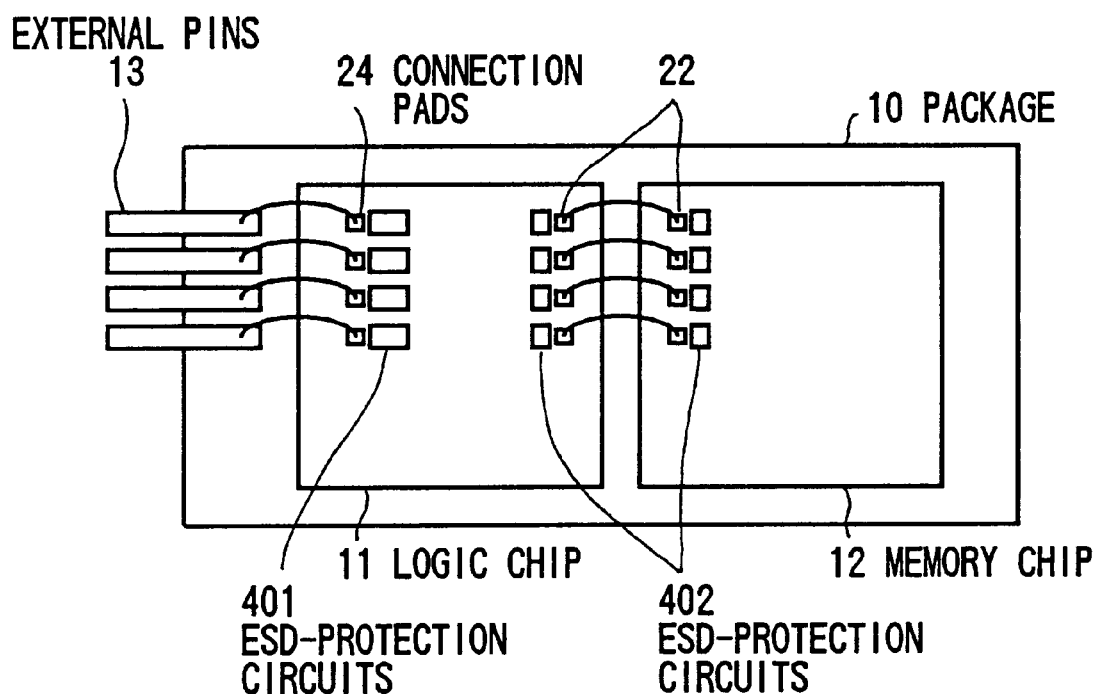
FIG. 20 is an illustrative drawing for explaining an ESD-protection circuit used in the semiconductor system of FIG. 2.

FIG. 20 is an illustrative drawing for explaining an ESD-protection circuit used in the semiconductor system of FIG. 2. In FIG. 20, the same elements as those of FIG. 2 are referred to by the same numerals, and a description thereof will be omitted.

In general, semiconductor-chip nodes are equipped with ESD-protection circuits in order to avoid device destruction caused by ESD (electrical-static discharge). ESD includes a discharge taking place when a charged metal piece comes in contact with the device during wire-bonding processes, a discharge occurring when a charged human body touches the device, and a discharge occurring when a device package is charged and touches another object.

When the logic chip 11 and the memory chip 12 are implemented in the package 10 as in FIG. 2 or FIG. 20, the I/O pads 22 connecting between the logic chip 11 and the memory chip 12 are covered by the package 10 so that the I/O pads 22 will have no contact with a charged human body. Because of this, ESD-protection circuits 402 provided for the I/O pads 22 can be relatively smaller than ESD-protection circuits 401 provided for the external pins 13. Namely, the ESD-protection circuits 402 are sufficient if they have a capacity for only a small current.

The smaller the ESD-protection circuits 402, the smaller the chip size can be, which serves as a merit. Further, a size reduction in the ESD-protection circuits 402 results in a decrease in parasitic capacitance, thereby stepping up a speed of changes in signal levels.

Figure 21:
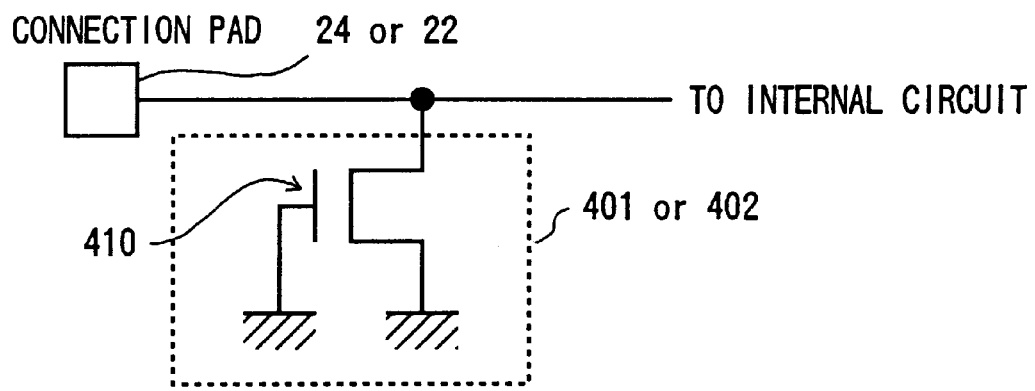
FIG. 21 is a circuit diagram of an embodiment of an ESD-protection circuit when a MOSFET is employed.

FIG. 21 is a circuit diagram of an embodiment of an ESD-protection circuit when a MOSFET is employed.

The ESD-protection circuit 401 (or 402) includes an NMOS transistor 410. If a voltage higher than a signal level is applied to a pad (one of the connection pads 24 or the I/O pads 22), the NMOS transistor 410 is turned on to prevent device destruction. In the case of the ESD-protection circuits 401, i.e., when used for the connection pads 24 connected to the external pins 13, the NMOS transistor 410 suffices if a gate widths thereof is as wide as 1000 $\mu$m. In the case of the ESD-protection circuits 402, i.e., when used for the I/O pads 22, the NMOS transistor 410 has a gate width of approximately 500 $\mu$m to serve the purposes.

Figure 22:
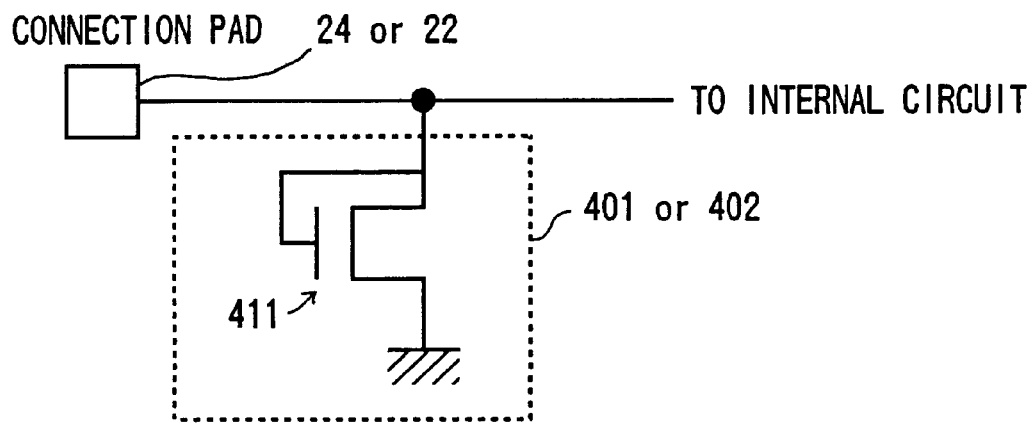
FIG. 22 is a circuit diagram of another embodiment of an ESD-protection circuit when a field-MOSFET is employed.

FIG. 22 is a circuit diagram of another embodiment of an ESD-protection circuit when a field-MOSFET is employed. The ESD-protection circuit 401 (or 402) includes a field-MOSFET 411 having a relatively high threshold voltage. If a voltage higher than a signal level is applied to a pad (one of the connection pads 24 or the I/O pads 22), the field-MOSFET 411 is turned on to prevent device destruction. In the case of the ESD-protection circuits 401, i.e., when used for the connection pads 24 connected to the external pins 13, the field-MOSFET 411 suffices if a gate widths thereof is as wide as 1000 $\mu$m. In the case of the ESD-protection circuits 402, i.e., when used for the I/O pads 22, the field-MOSFET 411 has a gate width of approximately 500 $\mu$m to serve the purposes.

Figure 23:
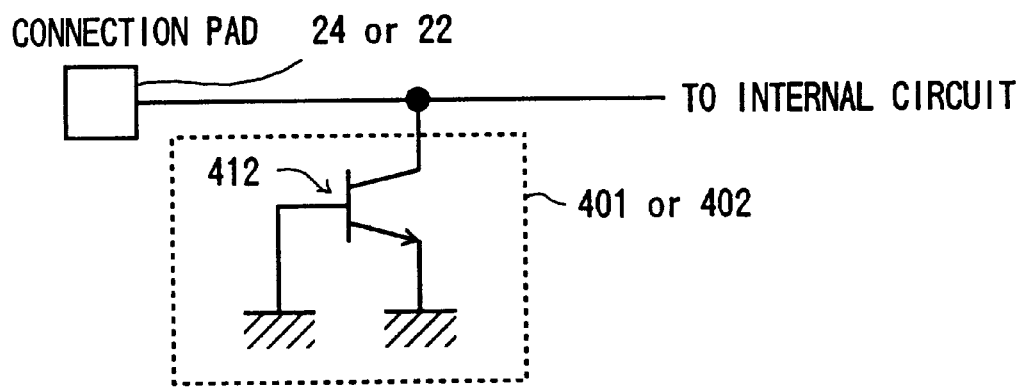
FIG. 23 is a circuit diagram of another embodiment of an ESD-protection circuit when a bipolar transistor is employed.

FIG. 23 is a circuit diagram of another embodiment of an ESD-protection circuit when a bipolar transistor is employed. The ESD-protection circuit 401 (or 402) includes a bipolar transistor 412. If a voltage higher than a signal level is applied to a pad (one of the connection pads 24 or the I/O pads 22), the bipolar transistor 412 is turned on to prevent device destruction. In the case of the ESD-protection circuits 401, i.e., when used for the connection pads 24 connected to the external pins 13, the bipolar transistor 412 suffices if an emitter size thereof is as wide as 300 $\mu$m$^2$. In the case of the ESD-protection circuits 402, i.e., when used for the I/O pads 22, the bipolar transistor 412 has an emitter size of approximately 100 $\mu$m$^2$ to serve the purposes.

Figure 24:
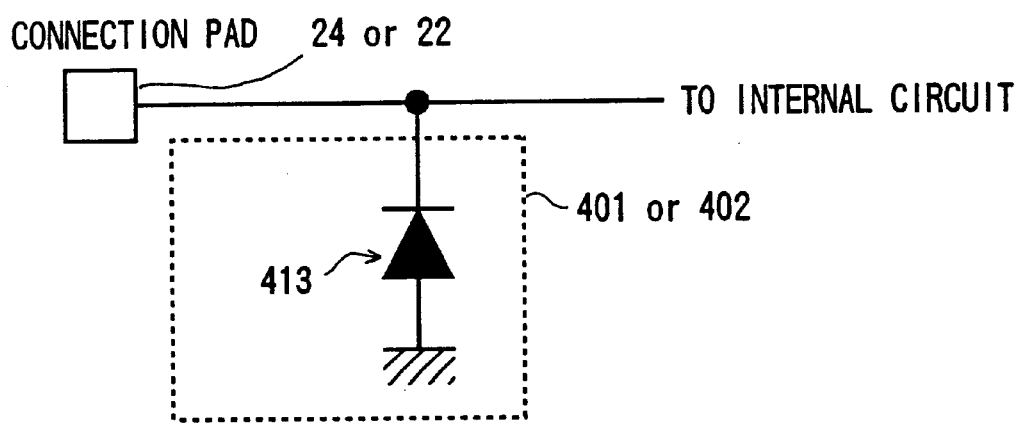
FIG. 24 is a circuit diagram of another embodiment of an ESD-protection circuit when a diode is employed.

FIG. 24 is a circuit diagram of another embodiment of an ESD-protection circuit when a diode is employed. The ESD-protection circuit 401 (or 402) includes a diode 413. If a voltage higher than a signal level is applied to a pad (one of the connection pads 24 or the I/O pads 22), the diode 413 is turned on to prevent device destruction. In the case of the ESD-protection circuits 401, i.e., when used for the connection pads 24 connected to the external pins 13, the diode 413 suffices if a junction size thereof is as wide as 300 $\mu$m$^2$. In the case of the ESD-protection circuits 402, i.e., when used for the I/O pads 22, the diode 413 has a junction size of approximately 100 $\mu$m$^2$ to serve the purposes.

Further, the present invention is not limited to these embodiments, but various variations and modifications may be made without departing from the scope of the present invention.

What is claimed is:

1. A semiconductor system comprising:

a logic chip;

a memory chip arranged such that one side of said memory chip faces one side of said logic chip;

first input/output nodes arranged along said one side of said logic chip;

second input/output nodes arranged along said one side of said memory chip;

connection wires connecting between said first input/output nodes and said second input/output nodes;

first input/output circuit provided in said logic chip and connected to said first input/output nodes;

second input/output circuit provided in said memory chip and connected to said second input/output nodes, wherein each of the first and second input/output circuits includes a signal output unit and a signal input unit, both of which are CMOS-type circuits;

a package housing said logic chip and said memory chip.

2. The semiconductor system as claimed in claim 1, wherein said first input/output nodes and said second input/output nodes are arranged to face each other between said logic chip and said memory chip.

3. The semiconductor system as claimed in claim 2, wherein all of said connection wires have the same length between said logic chip and said memory chip.

4. The semiconductor system as claimed in claim 3, wherein said connection lines connect between said first input/output nodes and said second input/output nodes by taking a path of a minimum length.

5. The semiconductor system as claimed in claim 1, further comprising power-voltage lines supplying power voltages commonly used by said first input/output circuit and said second input/output circuit.

6. The semiconductor system as claimed in claim 5, further comprising:

power-voltage nodes, situated on said one side of said logic chip, for receiving said power voltages from said power-voltage lines; and power-voltage nodes, situated on said one side of said memory chip, for receiving said power voltages from said power-voltage lines, wherein said power-voltage lines are arranged between said logic chip and said memory chip.

7. The semiconductor system as claimed in claim 5, further comprising:

a voltage-reduction circuit, provided in one of said logic chip and said memory chip, which lowers one of said power voltages to generate a reduced voltage;

a reduced-voltage connection line which conveys said reduced voltage from said one of said logic chip and said memory chip to another one of said logic chip and said memory chip.

8. The semiconductor system as claimed in claim 5, wherein said power-voltage lines provide dedicated power voltages for said first input/output circuit and said second input/output circuit.

9. The semiconductor system as claimed in claim 1, further comprising third input/output nodes, provided in said memory chip, for data transfer with a memory device situated outside said package, said third input/output nodes being arranged along another side of said memory chip different from said one side of said memory chip.

10. The semiconductor system as claimed in claim 9, wherein said memory chip comprises:

a first memory unit which accepts random access from said one logic chip; and a second memory unit which temporarily stores data supplied from said third input/output nodes before transferring said data to said first memory unit.

11. The semiconductor system as claimed in claim 9, wherein said memory chip comprises:

a first memory unit which accepts random access from said logic chip; and a second memory unit which temporarily stores data supplied from said first memory unit before transferring said data to said third input/output nodes.

12. A semiconductor device comprising:

a clock-input node situated on one side of a chip;

a plurality of input/output nodes arranged along said one side;

a control-clock generation circuit which generates an input/output-control clock signal based on a received clock signal received by said clock-input node;

a plurality of input/output circuits which conduct data output and data input via said input/output nodes in synchronism with said input/output-control clock signal; and a plurality of connection lines having an identical length and connecting between said control-clock generation circuit and said plurality of input/output circuits.

13. The semiconductor device as claimed in claim 12, wherein said control-clock generation circuit includes a first clock generation circuit which generates a data-output clock signal as said input/output-control clock signal.

14. The semiconductor device as claimed in claim 13, wherein said first clock generation circuit generates as said data-output clock signal a signal having a phase displacement relative to said received clock signal, said phase displacement being a total of a first delay of said plurality of connection lines and a second delay of said plurality of input/output circuits.

15. The semiconductor device as claimed in claim 14, wherein said first clock generation circuit comprises:

a phase-adjustment circuit which adjusts a phase of a delayed signal obtained by delaying said received clock signal;

a first unit which generates a first signal having said first delay relative to said delayed signal; and a second unit which generates a second signal having said second delay relative to said first signal, wherein said phase-adjustment circuit adjusts said phase of said delayed signal such that said second signal and said received clock signal have the same phase, said delayed signal being output as said data-output clock signal.

16. The semiconductor device as claimed in claim 12, wherein said control-clock generation circuit includes a second clock generation circuit which generates a data-input clock signal as said input/output-control clock signal.

17. The semiconductor device as claimed in claim 16, wherein said second clock generation circuit generates as said data-input clock signal a signal having a phase displacement relative to said received clock signal, said phase displacement being a total of a first delay of said plurality of connection lines and a second delay.

18. The semiconductor device as claimed in claim 17, wherein said second clock generation circuit comprises:

a phase-adjustment circuit which adjusts a phase of a delayed signal obtained by delaying said received clock signal;

a first unit which generates a first signal having said first delay relative to said delayed signal; and a second unit which delays said delayed signal by said second delay, wherein said phase-adjustment circuit adjusts said phase of said delayed signal such that said first signal and said received clock signal have the same phase, said data-output clock signal being a signal obtained by said second unit as said second unit delays said delayed signal by said second delay.

19. The semiconductor device as claimed in claim 18, wherein said second unit comprises a phase-shift circuit delaying said delayed signal by a 180° phase.

20. The semiconductor device as claimed in claim 18, wherein said second unit comprises a fixed-delay circuit delaying said delayed signal by a predetermined fixed delay.

21. The semiconductor device as claimed in claim 18, wherein said second clock generation circuit further includes a 1/N frequency divider which generates a plurality of frequency-divided clock signals having 1/N frequency of said received clock signal and having 360°/N-phase intervals therebetween, and wherein each of said plurality of input/output circuits includes N input circuits, said N input circuits each using a corresponding one of said frequency-divided clock signals as a synchronization signal.

22. The semiconductor device as claimed in claim 12, further comprises a clock-return node situated on said one side of said chip, said clock-return node outputting said received clock signal without any change after said received clock signal is received at said clock-input node.

23. A semiconductor device comprising:

an internal-clock generation circuit which receives an external clock signal provided from an external source and generates an internal-clock signal;

a clock-output node situated on one side of a chip and outputting said internal-clock signal;

a plurality of input/output nodes arranged along said one side;

a control-clock generation circuit which generates an input/output-control clock signal based on said internal-clock signal;

a plurality of input/output circuits which conduct data output and data input via said input/output nodes in synchronism with said input/output-control clock signal; and a plurality of connection lines having an identical length and connecting between said control-clock generation circuit and said plurality of input/output circuits.

24. The semiconductor device as claimed in claim 23, wherein said internal-clock generation circuit generates said internal-clock signal by performing frequency multiplication of said external clock signal.

25. The semiconductor device as claimed in claim 23, wherein said control-clock generation circuit includes a first clock generation circuit which generates a data-output clock signal as said input/output-control clock signal.

26. The semiconductor device as claimed in claim 25, wherein said first clock generation circuit generates as said data-output clock signal a signal having a phase displacement relative to said internal-clock signal, said phase displacement being a total of a first delay of said plurality of connection lines and a second delay of said plurality of input/output circuits.

27. The semiconductor device as claimed in claim 26, wherein said first clock generation circuit comprises:
 a phase-adjustment circuit which adjusts a phase of a delayed signal obtained by delaying said internal-clock signal;
 a first unit which generates a first signal having said first delay relative to said delayed signal; and
 a second unit which generates a second signal having said second delay relative to said first signal,
 wherein said phase-adjustment circuit adjusts said phase of said delayed signal such that said second signal and said internal-clock signal have the same phase, said delayed signal being output as said data-output clock signal.

28. The semiconductor device as claimed in claim 23, wherein said control-clock generation circuit includes a second clock generation circuit which generates a data-input clock signal as said input/output-control clock signal.

29. The semiconductor device as claimed in claim 28, wherein said second clock generation circuit generates as said data-input clock signal a signal having a phase displacement relative to said internal-clock signal, said phase displacement being a total of a first delay of said plurality of connection lines and a second delay.

30. The semiconductor device as claimed in claim 29, wherein said second clock generation circuit comprises:
 a phase-adjustment circuit which adjusts a phase of a delayed signal obtained by delaying said internal-clock signal;
 a first unit which generates a first signal having said first delay relative to said delayed signal; and
 a second unit which delays said delayed signal by said second delay,
 wherein said phase-adjustment circuit adjusts said phase of said delayed signal such that said first signal and said internal-clock signal have the same phase, said data-input clock signal being a signal obtained by said second unit as said second unit delays said delayed signal by said second delay.

31. The semiconductor device as claimed in claim 30, wherein said second unit comprises a phase-shift circuit delaying said delayed signal by a 180° phase.

32. The semiconductor device as claimed in claim 30, wherein said second unit comprises a fixed-delay circuit delaying said delayed signal by a predetermined fixed delay.

33. The semiconductor device as claimed in claim 30, wherein said second clock generation circuit further includes a 1/N frequency divider which generates a plurality of frequency-divided clock signals having 1/N frequency of said internal-clock signal and having 360°/N-phase intervals therebetween, and wherein each of said plurality of input/output circuits includes N input circuits, said N input circuits each using a corresponding one of said frequency-divided clock signals as a synchronization signal.

34. The semiconductor device as claimed in claim 23, further comprising a clock-return node situated on said one side of said chip, said clock-return node receiving said internal-clock signal a predetermined delay time after said internal-clock signal is transmitted from said clock-output node, wherein said control-clock generation circuit comprises:
 a first clock generation circuit which generates a data-output clock signal as one type of said input/output-control clock signal based on said internal-clock signal supplied from said internal-clock generation circuit; and
 a second clock generation circuit which generates a data-input clock signal as another type of said input/output-control clock signal based on said internal-clock signal received at said clock-return node.

35. A semiconductor system comprising:
 at least one first semiconductor chip;
 at least one second semiconductor chip arranged such that one side of said at least one second semiconductor chip faces one side of said at least one first semiconductor chip; and
 a package housing said at least one first semiconductor chip and said at least one second semiconductor chip,
 wherein said at least one first semiconductor chip and said at least one second semiconductor chip comprise at least one logic chip and at least one memory chip, and said at least one first semiconductor chip comprises:
  an internal-clock generation circuit which receives an external clock signal provided from an external source and generates an internal-clock signal;
  a clock-output node situated on said one side of said at least one first semiconductor chip and outputting said internal-clock signal;
  a plurality of first input/output nodes arranged along said one side of said at least one first semiconductor chip;
  a first control-clock generation circuit which generates a first input/output-control clock signal based on said internal-clock signal;
  a plurality of first input/output circuits which conduct data output and data input via said first input/output nodes in synchronism with said first input/output-control clock signal; and
  a plurality of connection lines having an identical length and connecting between said first control-clock generation circuit and said plurality of first input/output circuits,
 and wherein said at least one second semiconductor chip comprises:
  a clock-input node situated on said one side of said at least one second semiconductor chip and receiving said internal-clock signal from said at least one first semiconductor chip;
  a plurality of second input/output nodes arranged along said one side of said at least one second semiconductor chip and connected to said plurality of first input/output nodes;
  a second control-clock generation circuit which generates a second input/output-control clock signal based on said internal-clock signal received at said clock-input node;
  a plurality of second input/output circuits which conduct data output and data input via said second input/output nodes in synchronism with said second input/output-control clock signal; and
  a plurality of connection lines having an identical length and connecting between said second control-clock generation circuit and said plurality of second input/output circuits.

36. The semiconductor system as claimed in claim 35, wherein said at least one second semiconductor chip further comprises a first clock-return node situated on said one side of said at least one second semiconductor chip and outputting said internal-clock signal without any change after said internal-clock signal is received at said clock-input node, and said at least one first semiconductor chip further comprises a second clock-return node situated on said one side of said at least one first semiconductor chip and connected to said first clock-return node, and wherein said first control-clock generation circuit comprises:

a first clock generation circuit which generates a data-output clock signal as one type of said first input/output-control clock signal based on said internal-clock signal supplied from said internal-clock generation circuit; and a second clock generation circuit which generates a data-input clock signal as another type of said first input/output-control clock signal based on said internal-clock signal received at said second clock-return node.

37. A semiconductor memory chip of $2^M$ bits×N words× $2^L$ banks (M, N, L: integers), said semiconductor memory chip comprising:

a clock-input node;

M address-signal nodes;

N data-input/output nodes;

L bank-selection-signal nodes;

3 command-selection nodes;

a power-down-signal node;

DM-signal nodes provided for a unit of a byte; and a plurality of power-voltage nodes, wherein said clock-input node, said M address-signal nodes, said N data-input/output nodes, said L bank-selection-signal nodes, said 3 command-selection nodes, said power-down-signal node, said DM-signal nodes, and said plurality of power-voltage nodes are provided on one side of said semiconductor memory chip.

38. The semiconductor memory chip as claimed in claim 37, further comprising a clock-return node situated on said one side and outputting a clock signal without any change after said clock signal is received at said clock-input node.

39. The semiconductor memory chip as claimed in claim 38, further comprising at least one of a PLL circuit and a DLL circuit, wherein said plurality of power-voltage nodes include dedicated power-voltage nodes which supply dedicated power voltages to said at least one of a PLL circuit and a DLL circuit.

40. A semiconductor system comprising:

a package; and a plurality of semiconductor chips contained in said package, wherein said plurality of semiconductor chips comprise:

external-connection pads connected with an outside of said package;

inter-chip-connection pads connected between said plurality of semiconductor chips;

a first ESD-protection circuit provided for each of said external-connection pads in order to prevent device destruction caused by electrical-static discharge, said first ESD-protection circuit having a first capacity to drive an electric current; and a second ESD-protection circuit provided for each of said inter-chip-connection pads in order to prevent device destruction caused by electrical-static discharge, said second ESD-protection circuit having a second capacity to drive an electric current, wherein said second capacity is smaller than said first capacity.

41. The semiconductor system as claimed in claim 40, wherein said first ESD-protection circuit comprises a first MOSFET and said second ESD-protection circuit comprises a second MOSFET, said second MOSFET having a gate width narrower than that of said first MOSFET.

42. The semiconductor system as claimed in claim 40, wherein said first ESD-protection circuit comprises a first bipolar transistor and said second ESD-protection circuit comprises a second bipolar transistor, said second bipolar transistor having an emitter size smaller than that of said first bipolar transistor.

43. The semiconductor system as claimed in claim 40, wherein said first ESD-protection circuit comprises a first diode and said second ESD-protection circuit comprises a second diode, said second diode having a junction size smaller than that of said first diode.

* * * * *